US010651353B2

(12) United States Patent
Senuki et al.

(10) Patent No.: US 10,651,353 B2
(45) Date of Patent: May 12, 2020

(54) LIGHT-EMITTING DEVICE INCLUDING A REFLECTIVE ELEMENT

(71) Applicant: PANASONIC INTELLECTUAL PROPERTY MANAGEMENT CO., LTD., Osaka (JP)

(72) Inventors: Takuya Senuki, Kagoshima (JP); Toshiya Fukudome, Toyama (JP); Shigeo Hayashi, Kagoshima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/868,952

(22) Filed: Jan. 11, 2018

(65) Prior Publication Data
US 2018/0138377 A1 May 17, 2018

Related U.S. Application Data

(63) Continuation of application No. PCT/JP2016/003375, filed on Jul. 19, 2016.
(Continued)

(51) Int. Cl.
*H01L 33/54* (2010.01)
*H01L 33/60* (2010.01)
(Continued)

(52) U.S. Cl.
CPC ............ *H01L 33/54* (2013.01); *H01L 25/167* (2013.01); *H01L 33/60* (2013.01); *H01L 25/0753* (2013.01); *H01L 33/505* (2013.01)

(58) Field of Classification Search
CPC ......... H01L 33/20; H01L 33/38; H01L 33/44; H01L 33/54; H01L 33/60; H01L 33/483;
(Continued)

(56) References Cited

U.S. PATENT DOCUMENTS 9,379,094 B2 * 6/2016 Wada ................... H01L 33/46
2009/0166657 A1 7/2009 Yamada et al.
(Continued)

FOREIGN PATENT DOCUMENTS

JP 2009-164157 A 7/2009
JP 2012-079817 A 4/2012
(Continued)

OTHER PUBLICATIONS

International Search Report and Written Opinion issued in International Patent Application No. PCT/JP2016/003375, dated Sep. 20, 2016; with partial English translation.

*Primary Examiner* — Shaun M Campbell
*Assistant Examiner* — Suberr L Chi
(74) *Attorney, Agent, or Firm* — McDermott Will & Emery LLP

(57) ABSTRACT

A light-emitting device includes a light-emitting element disposed on a mount substrate, a reflective member disposed around the light-emitting element to cover the light-emitting element, and a dam disposed on opposite sides of the reflective member. The dam includes a resin dam, and a surface layer covering at least part of a surface of the resin dam. The inner lateral surface of the resin dam facing the light-emitting element is covered with the surface layer, and at least part of the outer lateral surface of the resin dam not facing the light-emitting element is an exposed surface.

11 Claims, 14 Drawing Sheets

Related U.S. Application Data

(60) Provisional application No. 62/195,761, filed on Jul. 22, 2015.

(51) Int. Cl.
  *H01L 25/16* (2006.01)
  *H01L 25/075* (2006.01)
  *H01L 33/50* (2010.01)

(58) Field of Classification Search
  CPC ............... H01L 33/486; H01L 33/505; H01L 33/52–56; H01L 2933/005; H01L 33/00–648; H01L 23/12–3192
  See application file for complete search history.

(56) References Cited

U.S. PATENT DOCUMENTS

| | | | |
|---|---|---|---|
| 2010/0044735 A1* | 2/2010 | Oyamada | H01L 33/504 257/98 |
| 2012/0104452 A1 | 5/2012 | Miyoshi et al. | |
| 2013/0154130 A1* | 6/2013 | Peil | H01L 21/56 257/791 |
| 2014/0183591 A1* | 7/2014 | Jow | H01L 27/14618 257/99 |
| 2014/0203305 A1* | 7/2014 | Kawano | H01L 33/486 257/88 |
| 2016/0133610 A1* | 5/2016 | Reiherzer | H01L 25/0753 257/98 |

FOREIGN PATENT DOCUMENTS

| | | |
|---|---|---|
| JP | 2012-099544 A | 5/2012 |
| JP | 2015-099940 A | 5/2015 |

\* cited by examiner

CUTTING LINE

LIGHT-EMITTING DEVICE INCLUDING A REFLECTIVE ELEMENT

CROSS REFERENCE TO RELATED APPLICATIONS

This application is a U.S. continuation application of PCT International Patent Application Number PCT/JP2016/003375 filed on Jul. 19, 2016, claiming the benefit of priority of United States Provisional Application No. 62/195,761 filed on Jul. 22, 2015, the entire contents of which are hereby incorporated by reference.

BACKGROUND

1. Technical Field

The present disclosure relates to light-emitting devices.

2. Description of the Related Art

Semiconductor light-emitting elements such as light emitting diodes and laser diodes have been used as light sources for headlamps of vehicles and those for outdoor and indoor lightings. In these light-emitting elements, the orientation distribution and color of light are controlled by light-reflective members coating the side faces of the light-emitting elements (see Japanese Patent Application Unexamined Nos. 2012-99544, 2012-79817, and 2009-164157, for example).

Japanese Patent Application Unexamined Nos. 2012-99544, 2012-79817, and 2009-164157 each disclose a light-emitting device including a substrate, and a light-emitting element disposed on the substrate and having wiring formed thereon. On the substrate, a frame-shaped light-reflective resin is formed so as to surround the light-emitting element. The light-reflective resin is applied in the state of viscous liquid so as to surround the light-emitting element, and is cured. A sealing resin containing a fluorescent substance is filled into spaces between the light-reflective resin and the light-emitting element. The sealing resin in the state of viscous liquid is filled into the spaces between the light-emitting element and the light-reflective resin, and is cured. The light-emitting element is thereby sealed on the substrate.

SUMMARY

During application of the light-reflective resin so as to surround the light-emitting element, these conventional light-emitting devices have a reduction in properties of the contact points of electronic components because the matrix resin of the light-reflective resin exudates to cover the electronic components around the light-emitting element. To seal the light-emitting element, the light-reflective resin should be higher than the light-emitting element. Unfortunately, there are technical difficulties in formation of a frame of a light-reflective resin so as to have a sufficient height by a single application operation. To prevent an increase in size of the light-emitting device, the frame of the light-reflective resin should have a smaller width. Unfortunately, the matrix resin exuding obstructs a reduction in width of the frame of the light-reflective resin.

Furthermore, a large coating nozzle cannot be brought close to the light-emitting element during coating of a material for the light-reflective member. For this reason, such a large nozzle cannot apply the light-reflective resin as close to the light-emitting element as possible, preventing a reduction in size of the light-emitting device.

To solve these problems, an object of the present disclosure is to provide a small light-emitting device having excellent properties.

The light-emitting device according to one aspect of the present disclosure includes a light-emitting device, including a light-emitting element disposed on a mount substrate; a reflective resin disposed around the light-emitting element to cover the light-emitting element; and a dam disposed on opposite sides of the reflective member. The dam includes a resin dam, and a surface layer covering at least part of a surface of the resin dam, an inner lateral surface of the resin dam facing the light-emitting element is covered with the surface layer, and at least part of an outer lateral surface of the resin dam not facing the light-emitting element is an exposed surface of the resin dam.

The present disclosure can provide a small light-emitting device having excellent properties.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Figure 1:
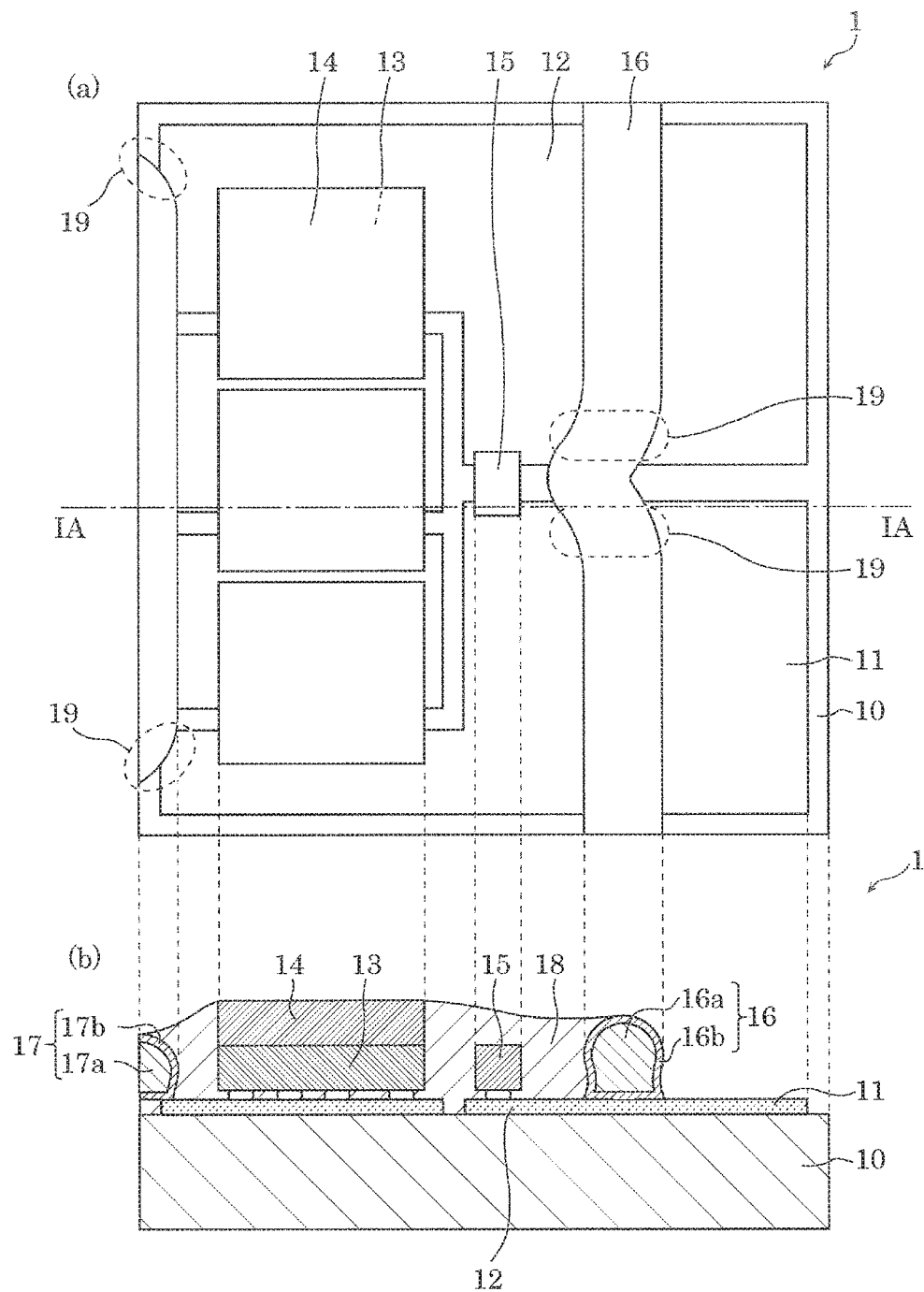
FIG. 1 is a schematic view illustrating one example of a configuration of the light-emitting device according to an embodiment; (a) of FIG. 1 is a plan view thereof, and (b) of FIG. 1 is a cross-sectional view taken along the line IA-IA in (a) of FIG. 1.

The embodiments according to the present disclosure will now be described with reference to the drawings. The embodiments described below all illustrate preferred specific examples of the present disclosure. Accordingly, numeral values, shapes, components, arrangements, positions, and connection forms of the components, steps, order of the steps, and the like shown in the embodiments below are only examples, and will not limit to the present invention. Among the components in the embodiments below, components not described in independent claims expressing the highest concept will be described as arbitrary components.

The attached drawings are schematic views, and are not always strict illustrations. In the drawings, identical reference numerals are given to substantially identical configurations, and duplication of the description will be omitted or simplified.

(Embodiments)

[1. Basic Configuration of Light-emitting Device]

A basic configuration of a light-emitting device will be described with reference to FIGS. 1 and 2.

Figure 2:
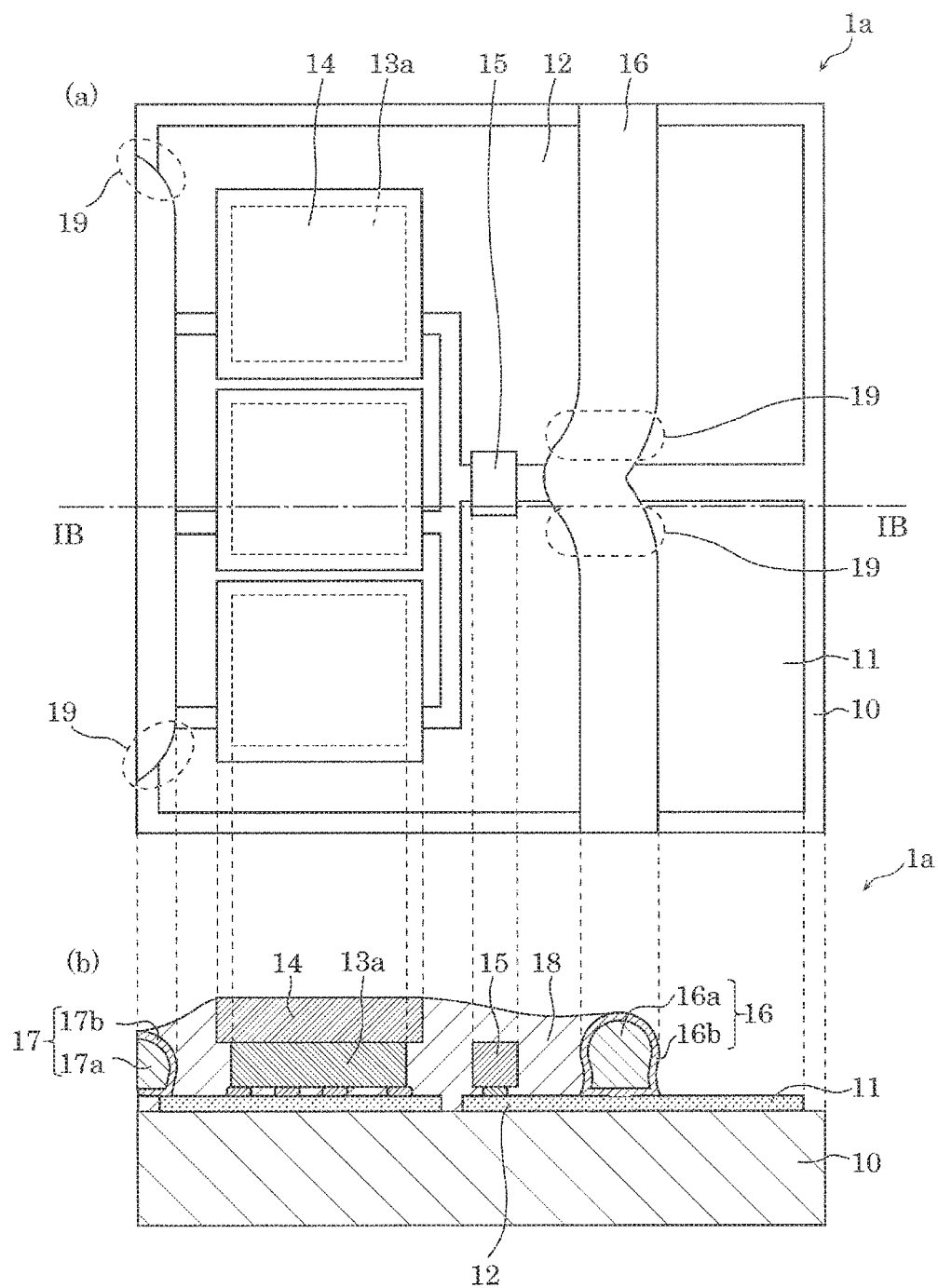
FIG. 2 is a schematic view illustrating another example of the configuration of the light-emitting device according to the embodiment; (a) of FIG. 2 is a plan view thereof, and (b) of FIG. 2 is a schematic cross-sectional view taken along the line IB-IB in (a) of FIG. 2.

FIG. 1 is a schematic view illustrating one example of a configuration of the light-emitting device according to an embodiment; (a) of FIG. 1 is a plan view thereof, and (b) of FIG. 1 is a cross-sectional view taken along the line IA-IA in (a) of FIG. 1. FIG. 2 is a schematic view illustrating another example of the configuration of the light-emitting device according to the embodiment; (a) of FIG. 2 is a plan view thereof, and (b) of FIG. 2 is a schematic cross-sectional view taken along the line IB-IB in (a) of FIG. 2. FIGS. 1 and 2 illustrate individual light-emitting devices, respectively. During production, a plurality of light-emitting devices is simultaneously produced through a process illustrated in FIG. 14 and FIGS. 15A to 15C described in detail later, and is finally separated into individual light-emitting devices through singulation Light-emitting device 1 illustrated in (a) and (b) of FIG. 1 includes mount substrate 10, extraction electrode 11, wiring electrode 12, light-emitting element 13, light-transmissive member 14, protective element 15, first dam 16, second dam 17, and reflective member 18.

More specifically, as illustrated in (b) of FIG. 1, light-emitting device 1 includes light-emitting element 13 flip-chip mounted on the surface of mount substrate 10. Light-emitting element 13 has a light-emitting surface bonded to light-transmissive member 14 with a transparent resin (not illustrated).

As illustrated in (a) of FIG. 1, three pairs of light-emitting element 13 and light-transmissive member 14 are disposed in one light-emitting device 1, for example. Three light-emitting elements 13 are disposed such that one sides of light-transmissive members 14 bonded to the top surfaces of light-emitting elements 13 are positioned on a straight line, and the straight line is parallel to the outer periphery of mount substrate 10.

Mount substrate 10 includes extraction electrodes 11 and wiring electrodes 12 patterned on the front surface of mount substrate 10. Light-emitting elements 13 are disposed to extend over two wiring electrodes 12, and are connected to wiring electrodes 12 with bumps. Protective element 15 is disposed on two wiring electrodes 12 so as to extend over two wiring electrodes 12, and is connected to the wiring electrodes.

First dam 16 and second dam 17 are disposed in positions spaced by a predetermined distance from the group of three light-emitting elements 13, light-transmissive member 14, and protective element 15. As illustrated in (b) of FIG. 1, first dam 16 is composed of first resin dam 16a and first surface layer 16b covering the surface of first resin dam 16a. Second dam 17 is composed of second resin dam 17a and second surface layer 17b covering the surface of second resin dam 17a. In second dam 17, the side opposite to the side including light-emitting element 13 and light-transmissive member 14 is formed approximately vertical to the surface of mount substrate 10. In other words, second dam 17 includes a flat surface approximately flush with the lateral surface of mount substrate 10. In the cross-section of second dam 17 disposed opposite to the side including light-emitting element 13 and light-transmissive member 14, only the uppermost portion of the flat surface of the second dam includes second surface layer 17b, and the remaining portion of the second resin dam is exposed without second surface layer 17b.

The spaces between first dam 16 and second dam 17 ranging from mount substrate 10 to the top ends of the side surfaces of light-transmissive members 14 are filled with reflective member 18. The top surfaces of light-transmissive members 14 are exposed without a coating with reflective member 18. Reflective member 18 coats the peripheries of light-emitting element 13, light-transmissive member 14, transparent resin and protective element 15. In other words, light-emitting elements 13 are connected to first dam 16 and second dam 17 with reflective member 18. Reflective member 18 is not disposed on the side opposite to the side including light-emitting element 13 with respect to first dam 16. Extraction electrode 11 is disposed on mount substrate 10 on the side opposite to the side including light-emitting element 13 with respect to first dam 16. Extraction electrode 11 is formed integrally with wiring electrode 12.

Mount substrate 10 is an insulating substrate, such as an AlN substrate. The surface of mount substrate 10 includes wiring electrode 12 and external extraction electrode 11 disposed thereon.

Extraction electrode 11 and wiring electrode 12 are formed by gold plating, for example. Extraction electrode 11 may be disposed on the rear surface of mount substrate 10. Although wiring electrode 12 has a complicated shape according to the electrode pattern of light-emitting element 13, FIGS. 1 and 2 illustrate a simplified shape of wiring electrode 12, respectively.

Light-emitting element 13 has a configuration (not illustrated) including a growth substrate such as a sapphire substrate or a GaN substrate, an n-type semiconductor layer, an active layer, and a p-type semiconductor layer disposed in sequence, an n-electrode disposed in the n-type semiconductor layer, and a p-electrode disposed in the p-type semiconductor layer. The growth substrate supports the semiconductor layers. The light generated in the activity layer (not illustrated) in light-emitting element 13 is emitted through the growth substrate to the side of light-transmissive member 14. In other words, the semiconductor layer side including the electrode of light-emitting element 13 (side of mount substrate 10 in (b) of FIG. 1) is the mount surface, and the growth substrate side (side of light-transmissive member 14 in (b) of FIG. 1) is the light-emitting surface. An insulating material such as sapphire, GaN, SiC, AlGaN, or AlN may be used as a material for the growth substrate.

Light-transmissive member 14 is a plate-shaped wavelength converting member formed of a wavelength converting material (fluorescent substance) for converting the wavelength of light from light-emitting element 13, the material being dispersed in a resin, ceramic, or glass material. The wavelength converting material is a known wavelength converting material, such as YAG, CASN, or SiAlON. In light-transmissive member 14, the surface of light-emitting element 13 side is a bonding surface to light-emitting element 13 and its opposite surface is a light-emitting surface of light-emitting device 1.

In (b) of FIG. 1, the light-emitting surface of light-emitting element 13 is bonded to light-transmissive member 14 with a transparent resin where their bonding surfaces have an identical dimension. The bonding surfaces of light-emitting surface of light-emitting element 13 and light-emitting element 13 of light-transmissive member 14 can have any dimension other than an identical dimension. For example, as illustrated in (a) and (b) of FIG. 2, the bonding surface of light-transmissive member 14 to light-emitting element 13 may be larger than that of the light-emitting surface of light-emitting element 13.

Protective element 15 is an element for protecting light-emitting element 13 against application of excess voltage, and is electrically connected to light-emitting element 13. Protective element 15 is a Zener diode, for example. Protective element 15 is disposed over two wiring electrodes 12 to be parallel to light-emitting element 13, and is connected to wiring electrodes 12. At this time, protective element 15 is connected to a metal pad on wiring electrodes 12 through a metal bump. Protective element 15 can be any other element than a Zener diode, such as a diode, a varistor, a capacitor, or a resistance.

The transparent resin not illustrated bonds light-emitting element 13 and light-transmissive member 14, and also functions as a light guiding member for guiding light emitted from the lateral surface of light-emitting element 13 to light-transmissive member 14. The transparent resin used is a transparent material (such as a silicone resin) to the light from light-emitting element 13.

Reflective member 18 is composed of a silicone resin containing light-reflective particles of titanium oxide. Reflective member 18 covers the lateral surfaces of light-emitting elements 13, the transparent resin, and light-transmissive members 14 to reflect the light emitted from light-emitting elements 13 to the light-emitting surfaces of light-transmissive members 14.

First dam 16 and second dam 17 are disposed such that a reflective member forming material as a material for forming reflective member 18 described later is filled into only desired regions on mount substrate 10 during filling of the reflective member forming material into spaces around light-emitting element 13. In other words, first dam 16 and second dam 17 are disposed so as to surround light-emitting element 13 to prevent the reflective member forming material from spreading to undesired regions. Alternatively, first dam 16 may be disposed at a position opposite to second dam 17 such that light-emitting element 13 and reflective member 18 are interposed between first dam 16 and second dam 17.

First dam 16 includes first resin dam 16a formed with a silicone resin containing light-reflective particles of titanium oxide, and first surface layer 16b disposed on the surface of first resin dam 16a. First surface layer 16b is formed with a resin contained in the material for forming first resin dam 16a to cover the entire outer surface of first resin dam 16a.

Similarly to first dam 16, second dam 17 includes second resin dam 17a and second surface layer 17b disposed on the surface of second resin dam 17a. The materials for second resin dam 17a and second surface layer 17b are the same as those for first resin dam 16a and first surface layer 16b.

The side of second dam 17 opposite to the side including light-emitting element 13 and light-transmissive member 14 is formed approximately vertical to mount substrate 10. In this case, second resin dam 17a is exposed on the side of second dam 17 disposed opposite to the side including light-emitting element 13 and light-transmissive member 14 without second surface layer 17b. The exposed surface of second resin dam 17a is flush with the lateral surface of mount substrate 10 as illustrated in (b) of FIG. 1.

As illustrated in (b) of FIG. 1, first resin dam 16a and second resin dam 17a are formed such that the heights from the surface of mount substrate 10 to the vertex portions of first resin dam 16a and second resin dam 17a are less than the height from the surface of mount substrate 10 to the top surface of light-transmissive member 14.

Seen from above, first dam 16 and second dam 17 have curved portions 19 curved so as to approach the semiconductor element. The configurations of first dam 16 and second dam 17 will be described later in detail.

First dam 16 and second dam 17 are collectively referred to as "dam" below unless any distinction between first dam 16 and second dam 17 is necessary. First resin dam 16a and second resin dam 17a are collectively referred to as "resin dam" unless any distinction between first resin dam 16a and second resin dam 17a is necessary. Similarly, first surface layer 16b and second surface layer 17b are collectively referred to as "surface layer" unless any distinction between first surface layer 16b and second surface layer 17b is necessary. Because light-emitting element 13 and protective element 15 both are semiconductor elements, light-emitting element 13 and protective element 15 are collectively referred to as "semiconductor element" unless any distinction between light-emitting element 13 and protective element 15 is necessary.

[2. Configuration of Dam]
[2-1. Arrangement of Dam]

The resin dam and the surface layer forming the dam are simultaneously formed through the same process.

The dams are disposed on mount substrate 10 on the opposite sides of light-emitting element 13. Specifically, as illustrated in FIG. 1, two dams are disposed facing each other on the opposite sides of light-emitting elements 13. One of the dams is second dam 17 on the side of light-emitting element 13. Second dam 17 is disposed between light-emitting elements 13 and the outer periphery of mount substrate 10 adjacent to light-emitting element 13. The other is first dam 16 on the side of extraction electrode 11. First dam 16 is disposed adjacent to a Zener diode (protective element 15) so as to extend over extraction electrodes 11.

As described above, the region of mount substrate 10 between first dam 16 and second dam 17 excluding the top surface of light-transmissive member 14 is filled with reflective member 18 so as to cover the lateral surfaces of light-emitting element 13, the transparent resin, and light-transmissive member 14. Reflective member 18 is also disposed in the spaces between light-emitting elements 13 and mount substrate 10. Wiring electrodes 12 to be connected to extraction electrodes 11 are disposed on mount substrate 10. Light-emitting elements 13 are disposed so as to be connected to wiring electrodes 12 through electrical conduction.

As described later, the dam is positioned through application of a paste of dam forming material from a nozzle into a linear form by a dispensing method.

In the dispensing method, the dam forming material is fed from the nozzle. Accordingly, the lower limit distance between the nozzle and a semiconductor element such as light-emitting element 13 or protective element 15 is determined according to the wall thickness of the nozzle. In the case where a method of feeding the dam forming material to mount substrate 10 with a nozzle from a high position is used, first dam 16 and second dam 17 can be disposed near the semiconductor element.

In the case where the dam forming material is applied to regions near the semiconductor element, as illustrated in FIG. 1, the dam forming material is applied in a manner approaching light-emitting elements 13 and protective element 15 in positions close to the positions where light-emitting elements 13 and protective element 15 are disposed. It is believed that this is because the dam forming material is approached to semiconductor elements, i.e., light-emitting elements 13 and protective element 15 by an electrostatic force. Using this physical phenomenon, the dam can be disposed close to the desired regions near the semiconductor elements even in the case where the dam forming material is ejected from the nozzle located at a position away from the semiconductor elements.

In the case where the dam is disposed near the semiconductor element, particularly light-emitting element 13, a sharp light emission edge is achieved in the near-field pattern of light emission. Accordingly, such a light-emitting device integrated into a system using an optical system achieves sharp light-emitting properties. This is useful in low beams of head lamps of vehicles.

The method of producing a dam will be described in detail later.

[2-2. Cross-sectional Shape of Dam]

Next, the cross-sectional shape of the dam will be described by way of first dam 16 with reference to FIGS. 3 to 6. The cross-sectional shape of second dam 17 is the same as that of first dam 16.

Figure 3:
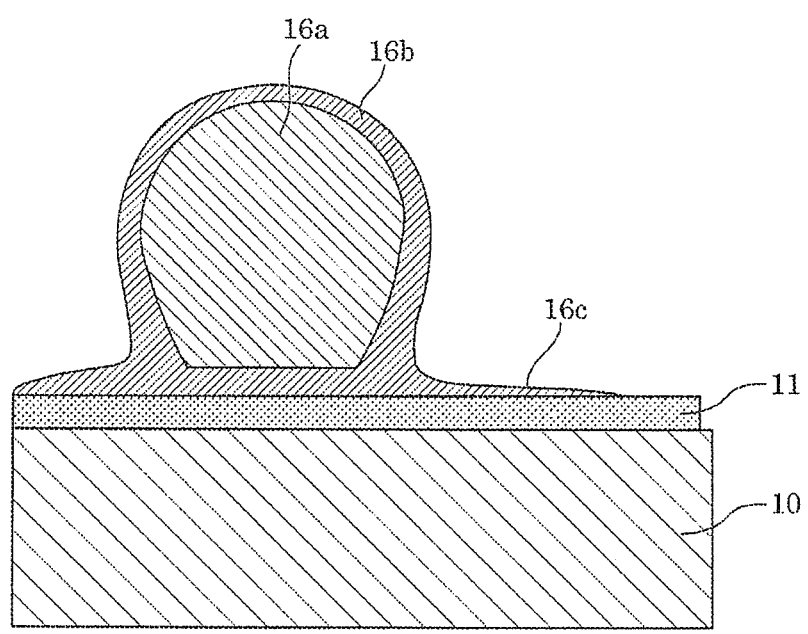
FIG. 3 is a cross-sectional view schematically illustrating the configuration of a first dam and its surroundings in a light-emitting device in a conventional example.
Figure 4:
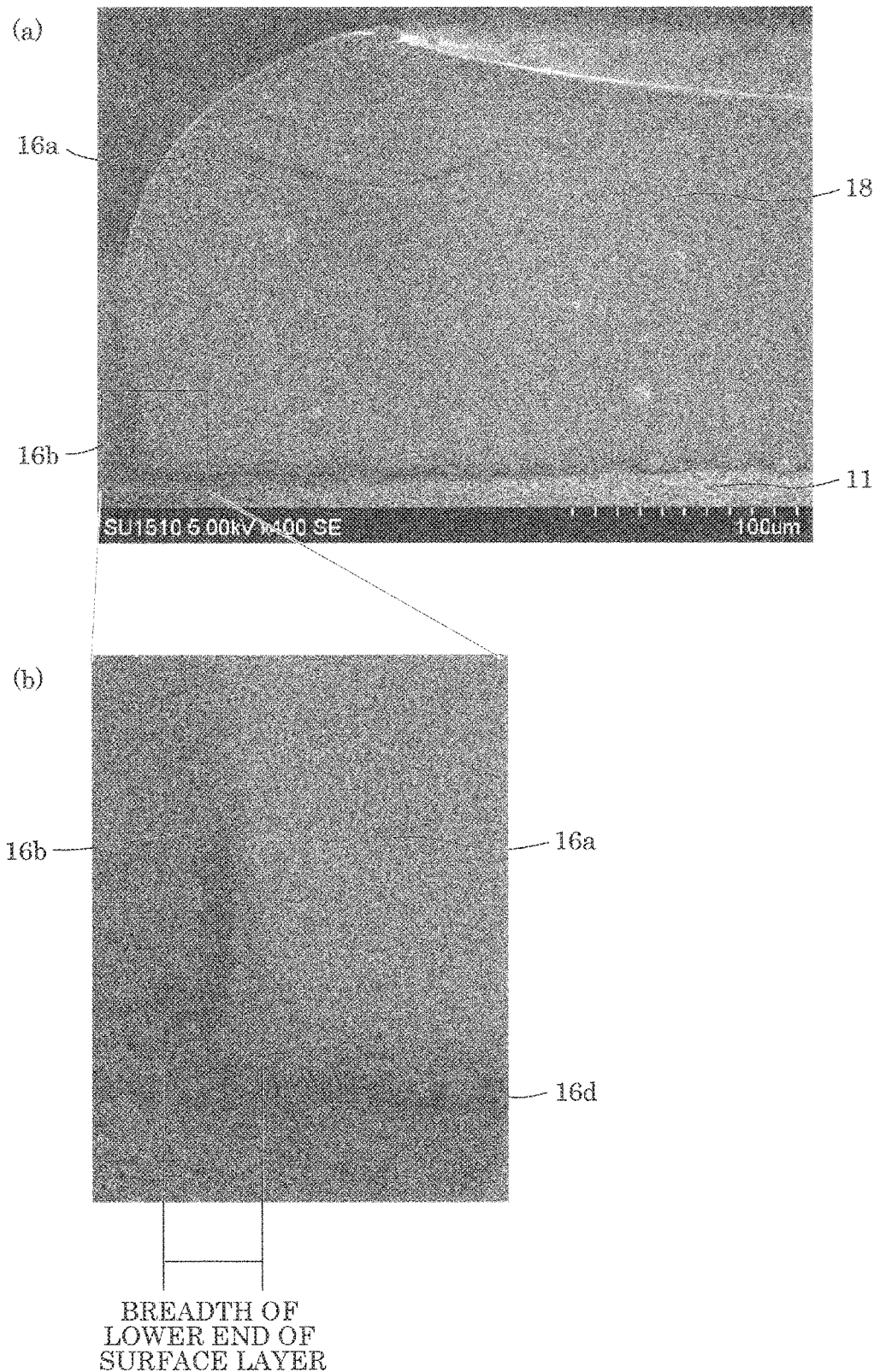
FIG. 4 is an SEM cross-sectional photograph illustrating the configuration of a first dam in the light-emitting device according to an embodiment.
Figure 5:
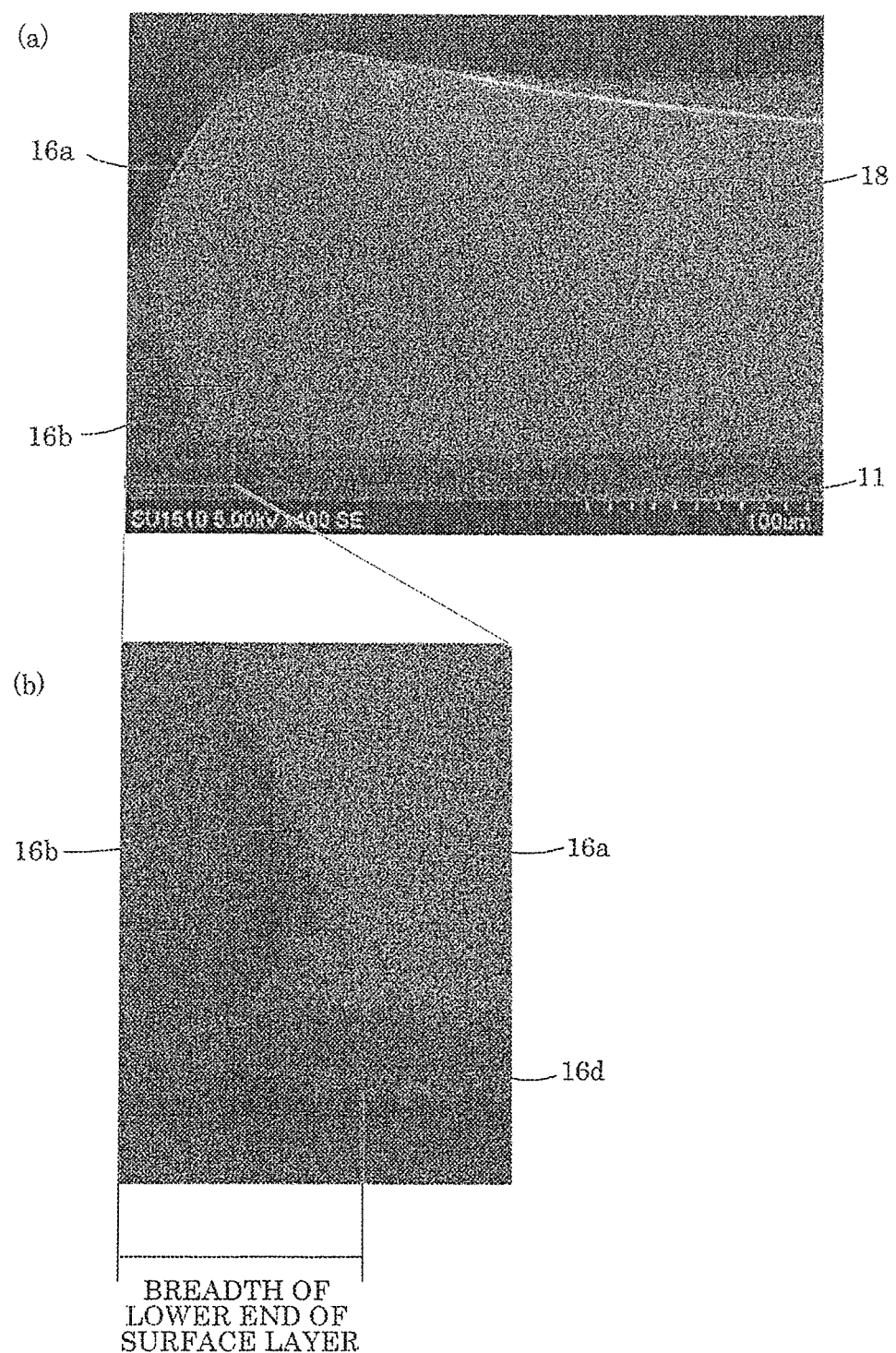
FIG. 5 is an SEM cross-sectional photograph illustrating the configuration of the first dam in the light-emitting device in the conventional example.
Figure 6:
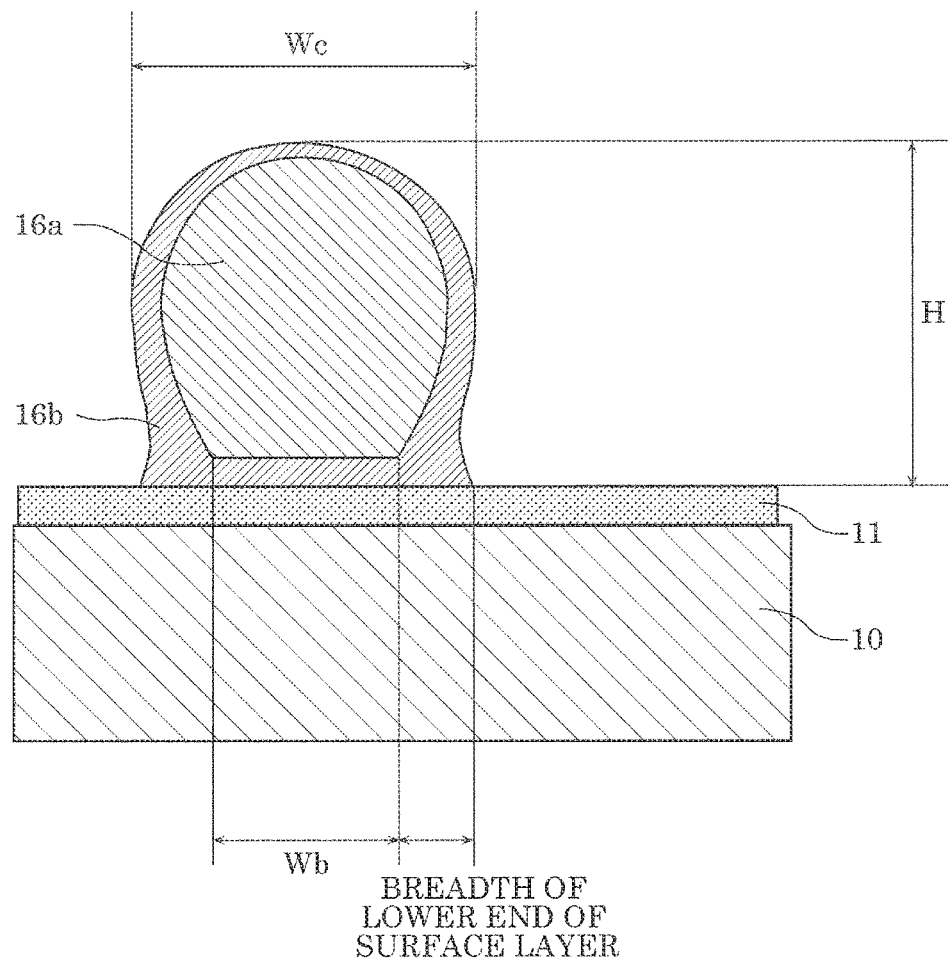
FIG. 6 is a cross-sectional view schematically illustrating the configuration of the first dam in the light-emitting device according to the embodiment.

FIG. 3 is a cross-sectional view schematically illustrating the configuration of a first dam and its surroundings in a light-emitting device in a conventional example. FIG. 4 is an SEM cross-sectional photograph illustrating the configuration of first dam 16 in light-emitting device 1. FIG. 5 is an SEM cross-sectional photograph of the configuration of the dam in a light-emitting device in a conventional example. FIG. 6 is a cross-sectional view schematically illustrating of the configuration of first dam 16 and its surroundings in light-emitting device 1 according to the present embodiment.

As illustrated in FIG. 6, first dam 16 is composed of first resin dam 16a, and first surface layer 16b covering the surface of first resin dam 16a. As described later, in one example of light-emitting device 1 according to the present embodiment, first dam 16 is formed: The dam forming material is applied onto mount substrate 10, and is left on the stage for five minutes. The dam forming material is then heated in an atmosphere at a temperature 60° C. higher than the gelation temperature of the dam forming material for three hours. Because the dam forming material for first dam 16 is a viscous liquid, first resin dam 16a has a narrow width and first surface layer 16b has an increasing width toward the lower end of first surface layer 16b due to the viscosity, surface tension, and curing temperature of the dam forming material, as illustrated in FIG. 6. For example, at a low curing temperature, the dam forming material may exude over extraction electrode 11, forming exuded portion 16c as illustrated in FIG. 3.

A specific shape of the lower end of first surface layer 16b will now be described.

In FIG. 4, reflective member 18 is formed in contact with first dam 16 on the right lateral surface side of first resin dam 16a (side of reflective member 18), i.e., on the side of light-emitting element 13. At this time, interface layer 16d is formed between resin dam 16 and extraction electrode 11. In the outer lateral surface of first dam 16 that does not have reflective member 18, the lower end of first surface layer 16b has a width of 40 nm, for example, from the surface of the lower end of first resin dam 16a to the outer surface of first surface layer 16b.

In the case where the temperature of the stage for supporting mount substrate 10 is controlled to be room temperature during application of the dam forming material, as illustrated in FIG. 5, the breadth of the lower end of the surface layer is two times or larger than that of first surface layer 16b according to the present embodiment. Composition analysis reveals that the breadth (exuded portion 16c) of the lower end of first surface layer 16b illustrated in FIG. 3 covers extraction electrode 11. Such a configuration will generate failure of contacts in electrodes in the case where a small extraction electrode is used. In the case where a large extraction electrode 11 is used in consideration of the breadth of the lower end of first surface layer 16b, the size of the entire light-emitting device will be increased. For such a reason, first dam 16 having a suitable dimension is required.

A specific shape and dimension of first dam 16 will now be described with reference to FIG. 6 and Table 1.

FIG. 6 is a schematic view illustrating the cross-sectional shapes of first resin dam 16a and first surface layer 16b. As illustrated in FIG. 6, the maximum width of the total width of first resin dam 16a and first surface layer 16b (maximum width of first dam 16) in the central portion in the height direction of first resin dam 16a is defined as Wc, the bottom width of only first resin dam 16a is defined as Wb, and the total height of first resin dam 16a and first surface layer 16b is defined as H.

A resin dam was formed while the temperature of the stage for supporting mount substrate 10 was varied during application of the dam forming material onto mount substrate 10. The sizes of the resin dam and the surface layer were measured on each condition. The results are shown in Table 1.

The dam forming material was applied onto mount substrate 10, and was left as it was on the stage for five minutes. The dam forming material was then heated in an atmosphere at a temperature about 60° C. higher than the gelation temperature of the dam forming material for three hours. This treatment was performed in the air atmosphere without controlling the air stream.

Table 1 shows that in the case where the stage had a temperature in the range of the temperature 5° C. lower than the gelation temperature of the dam forming material to the temperature 10° C. higher than the gelation temperature of the dam forming material, the ratio of the total height H of first resin dam 16a and first surface layer 16b (height of first dam 16) to maximum width Wc of the total width of first resin dam 16a and first surface layer 16b (maximum width of first dam 16) was larger than that in the case where the stage had a room temperature. In other words, the table shows that in the case where the stage had a temperature in the range of the temperature 5° C. lower than the gelation temperature of the dam forming material to the temperature 10° C. higher than the gelation temperature of the dam forming material, the height of the combined shape of first resin dam 16a and first surface layer 16b was increased in the height direction compared to the case where the stage had room temperature. For example, the table shows that in the case where the stage had a temperature of the temperature 5° C. lower than the gelation temperature of the dam forming material to the temperature 5° C. higher than the gelation temperature of the dam forming material, H/Wc>0.80, which was larger than H/Wc=0.71 at room temperature.

Comparison of Wb/Wc shows that in the case where the stage has a temperature in the range of the temperature 5° C. lower than the gelation temperature of the dam forming material to the temperature 5° C. higher than the gelation temperature of the dam forming material, Wb/Wc is 0.96 or larger than Wb/Wc=0.94 in the case where the stage has room temperature, more specifically, Wb/Wc>0.94. Accordingly, it is found that in the case where the stage has a temperature in the range of the temperature 5° C. lower than the gelation temperature of the dam forming material to the temperature 10° C. higher than the gelation temperature of the dam forming material, first surface layer 16b has a smaller thickness that that in the case where the stage has room temperature.

[2-3. Shear Strength of Dam]

The shear strength of the dam will now be described. The shear strength refers to a stress mechanically applied to a dam from its lateral side to cause peel-off of the dam from extraction electrode 11 or breakage of the dam.

Figure 7:
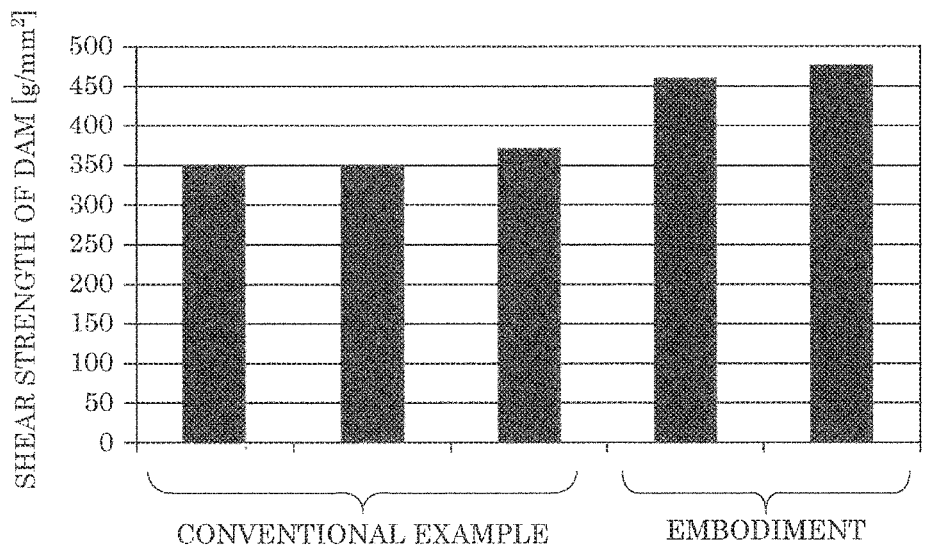
FIG. 7 is a diagram illustrating the shear strengths of the first dams in the light-emitting devices according to an embodiment and the dams in a conventional example.

FIG. 7 illustrates the results of measurement of the shear strengths of the dam in light-emitting device 1 according to the present embodiment and a dam having a conventional structure. FIG. 7 shows two results of measurement in the dam according to the present embodiment and three results of measurement in the dam according to the conventional example. The shear strength of the dam was measured with BONDING TESTER (made by RHESCA Co., Ltd.) PTR-1100. The measurement was performed with a probe for 5 kg at a locate amount of 2.0 µm, a moving rate of 0.1 mm/s, and a moving distance of 1.5 mm.

As illustrated in FIG. 7, the dam according to the present embodiment had a shear strength of 450 g/mm$^2$ or more (average: 465 g/mm$^2$) in both of the two measurements. In contrast, the dam according to the conventional example had a shear strength of about 350 g/mm$^2$ (average: 358 g/mm$^2$) in each of the three measurements. Accordingly, the results show that the shear strength of the dam having a structure according to the present embodiment was about 30% increased, compared to that of the dam having a conventional structure.

This is because in the case where the resin dam and the surface layer are formed with the same amount of dam forming material in the conventional method and the method according to the present embodiment and the bottom area of the dam according the present embodiment is the same as that of the dam having a conventional structure, the dam according to the present embodiment has a larger height and has a larger cross-sectional area in the direction vertical to mount substrate 10 than those of the dam formed by the conventional method. A dam having such a configuration disperses the force per unit area applied from the lateral surface direction of the dam. Moreover, the resin dam has a larger bottom width than in the conventional example, increasing the bottom area of the resin dam. As a result, the dam itself has a stable structure, increasing the bonding strength to mount substrate 10.

[2-4. Planar Shape of Dam]

The planar shape of the dam including a surface layer and a resin dam will now be described.

[2-4-1. Shape 1]

FIGS. 8A to 8D are schematic plan views each illustrating a light-emitting device including dams formed into an approximately linear form such that the light-emitting elements and the protective element are interposed between the dams; (a) of FIGS. 8A to 8D illustrates singulation of the light-emitting device in the case where part of the dam is not cut parallel to the long side direction of the light-emitting device, and (b) of FIGS. 8A to 8D illustrates singulation of the light-emitting device in the case where part of the dam is cut parallel to the long side direction of the light-emitting device.

Figure 8A:
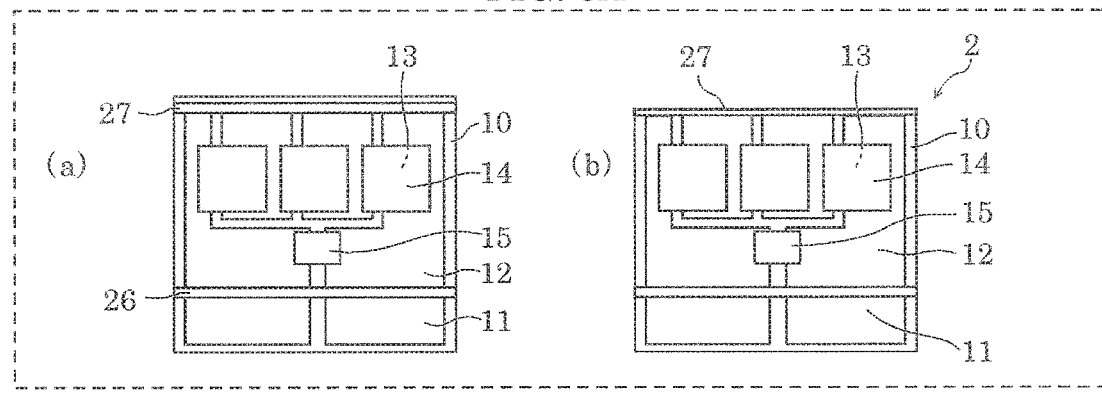
FIG. 8A is a schematic plan view illustrating a light-emitting device including dams formed into an approximately linear form such that a light-emitting element and a protective element are interposed between the dams.
Figure 8B:
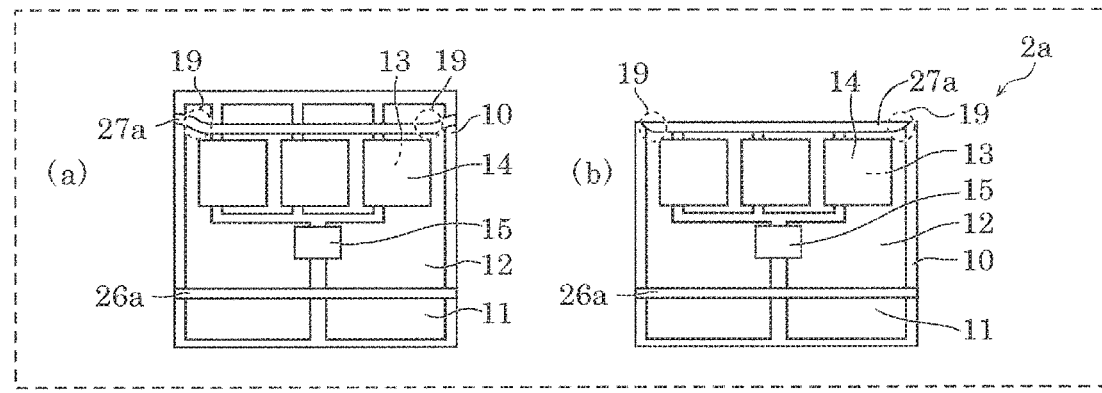
FIG. 8B is a schematic plan view illustrating a light-emitting device including dams formed into an approximately linear form such that a light-emitting element and a protective element are interposed between the dams.
Figure 8C:
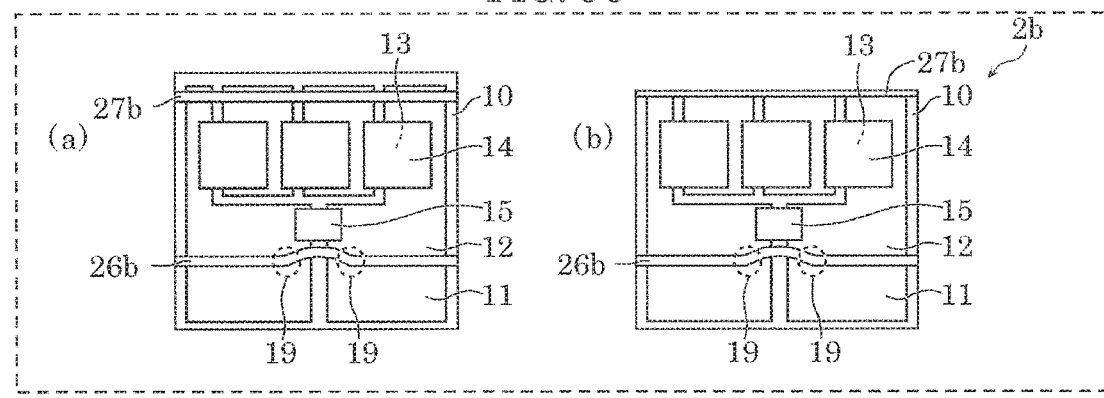
FIG. 8C is a schematic plan view illustrating a light-emitting device including dams formed into an approximately linear form such that a light-emitting element and a protective element are interposed between the dams.
Figure 8D:
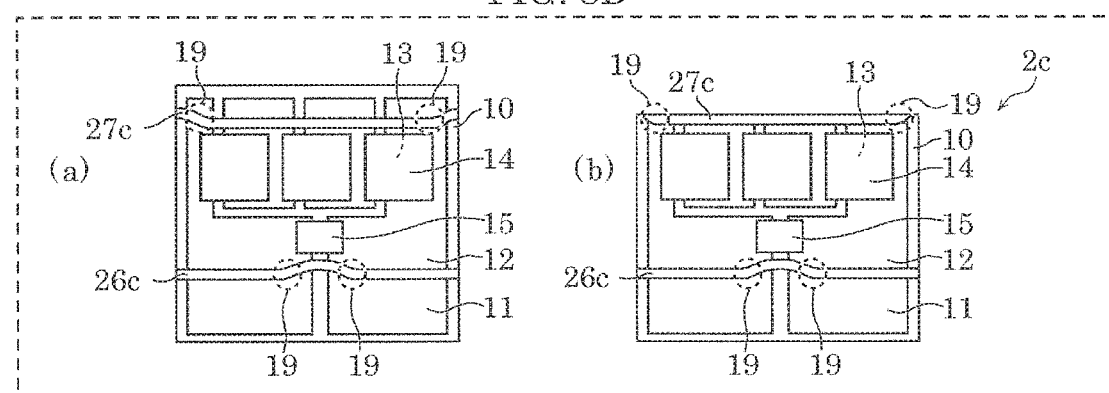
FIG. 8D is a schematic plan view illustrating a light-emitting device including dams formed into an approximately linear form such that a light-emitting element and a protective element are interposed between the dams.

Light-emitting device 2 illustrated in FIG. 8A is a basic configuration of light-emitting devices 2a to 2c illustrated in FIGS. 8B to 8D. In light-emitting device 2 including mount substrate 10 and a pair of extraction electrodes 11 formed thereon, three light-emitting elements 13 are aligned on wiring electrodes 12 integrated with extraction electrodes 11. A Zener diode functioning as protective element 15 is disposed on wiring electrodes 12 disposed between light-emitting elements 13 and extraction electrodes 11. Each light-emitting element 13 includes light-transmissive member 14 bonded to the surface of the light-emitting element opposite to mount substrate 10. The diagram illustrates the top surface of light-transmissive member 14.

In light-emitting device 2, two dams each composed of the resin dam and the surface layer are disposed on mount substrate 10 on the opposite sides of light-emitting elements 13. One of the dams is second dam 27 disposed between light-emitting elements 13 and the outer periphery of mount substrate 10 adjacent to light-emitting elements 13. The other is first dam 26 disposed adjacent to the Zener diode or protective element 15 so as to extend over extraction electrodes 11. First dam 26 and second dam 27 each are formed into an approximately straight line across a plurality of light-emitting devices 2. FIG. 8A illustrates first dam 26 and second dam 27 in light-emitting device 2 cut in the singulation step of light-emitting device 2.

The dam is positioned on mount substrate 10 through application of a paste of dam forming material into a narrow line from a nozzle by the dispensing method. Here, as illustrated in FIGS. 8B to 8D, the dam forming material is approached to the semiconductor element (such as light-emitting element 13 or protective element 15) near the semiconductor element by the electrostatic force of the semiconductor element, and is disposed on mount substrate 10 such that the dam includes curved portions 19 curved so as to approach the semiconductor element. Thermal curing of the dam forming material in this state results in the formation of the dam having curved portions 19 curved so as to approach the semiconductor element.

In light-emitting device 2a illustrated in FIG. 8B, second dam 27a is disposed along the alignment direction of a group of three aligned light-emitting elements 13 so as to approach one side of the group of light-emitting elements 13 opposite to the side including protective element 15. Second dam 27a includes curved portions 19 disposed near the corners of light-emitting elements 13 disposed at two ends of the group of three aligned light-emitting elements 13. First dam 26a has no curved portions, similarly to first dam 26 illustrated in FIG. 8A.

In light-emitting device 2b illustrated in FIG. 8C, first dam 26b is disposed so as to approach one side of protective element 15. First dam 26b includes curved portions 19 formed near the corners of protective element 15. Second dam 27b has no curved portions similarly to second dam 27 illustrated in FIG. 8A.

In light-emitting device 2c illustrated in FIG. 8D, both of first dam 26c and second dam 27c are disposed so as to approach one side of the group of light-emitting elements 13 and one side of protective element 15, respectively. First dam 26c includes curved portions 19 formed near the corners of protective element 15, and second dam 27c includes curved portions 19 formed near the corners of light-emitting elements 13 disposed at two ends of the group of three aligned light-emitting elements 13.

Curved portions 19 may be formed in any one of first dams 26, 26a, 26b, and 26c and any one of second dams 27, 27a, 27b, and 27c. Curved portions 19 are formed near the corners of the semiconductor elements. In other words, curved portions 19 each have the starting point at a corner of a semiconductor element. During singulation of light-emitting devices 2, 2a, 2b, and 2c illustrated in (b) of FIGS. 8A to 8D, second dams 27, 27a, 27b, and 27c are cut parallel to the long side direction of the group of light-emitting elements 13 in light-emitting devices 2, 2a, 2b, and 2c, respectively. Accordingly, second dams 27, 27a, 27b, and 27c have a width smaller than those of first dams 26, 26a, 26b, and 26c. Second dams 27, 27a, 27b, and 27c have an approximately flat surface on the lateral sides along the outer peripheries of light-emitting devices 2, 2a, 2b, and 2c, respectively. Furthermore, in light-emitting devices 2a and 2c illustrated in (b) of FIG. 8B and (b) of FIG. 8D and including curved portions 19 formed near the corners of light-emitting elements 13, the regions of second dams 27a and 27c nearer the outer peripheries of light-emitting devices 2, 2a, 2b, and 2c than curved portions 19 are cut off near the corners of the group of light-emitting elements 13, respectively. Second dams 27a and 27c have a length shorter than those of one sides of light-emitting devices 2, 2a, 2b, and 2c adjacent to second dams 27a and 27c, respectively.

[2-4-2. Shape 2]

Figure 9A:
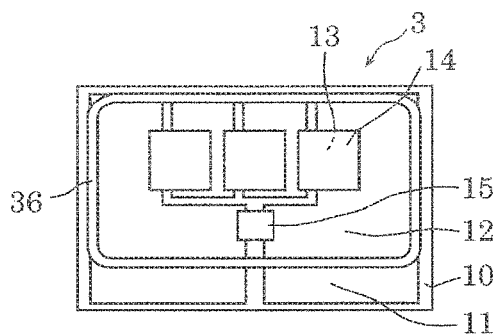
FIG. 9A is a schematic plan view illustrating a light-emitting device including a dam surrounding light-emitting elements and a protective element.
Figure 9B:
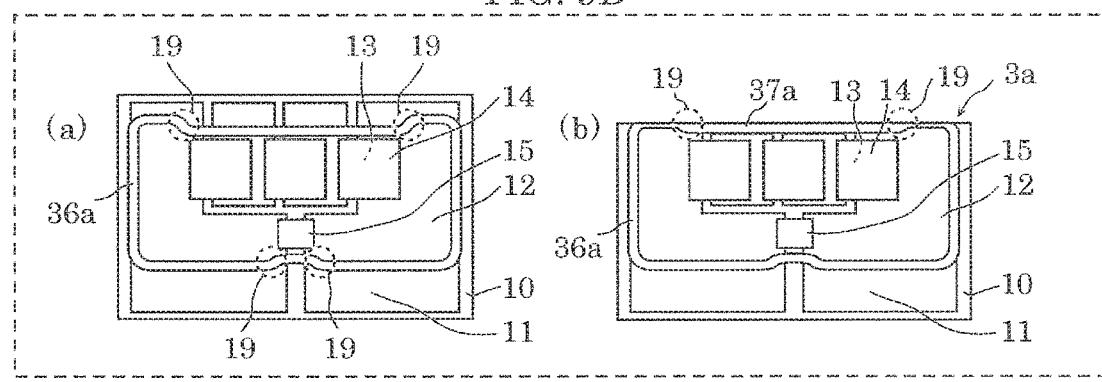
FIG. 9B is a schematic plan view illustrating a light-emitting device including a dam surrounding light-emitting elements and a protective element where only portions of the dam along the direction parallel to the alignment direction of the light-emitting elements are formed so as to approach the light-emitting elements.
Figure 9C:
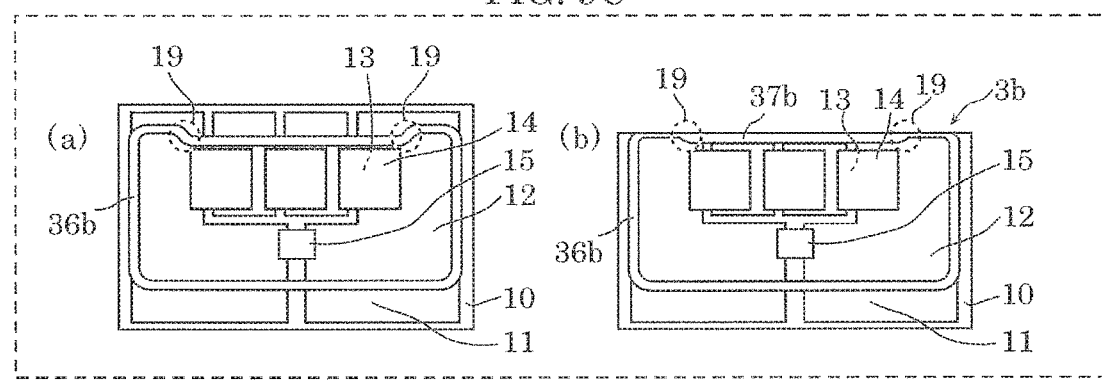
FIG. 9C is a schematic plan view illustrating a light-emitting device including a dam surrounding light-emitting elements and a protective element where only a portion of the dam along the direction parallel to the alignment direction of the light-emitting elements is formed so as to approach the light-emitting elements.
Figure 9D:
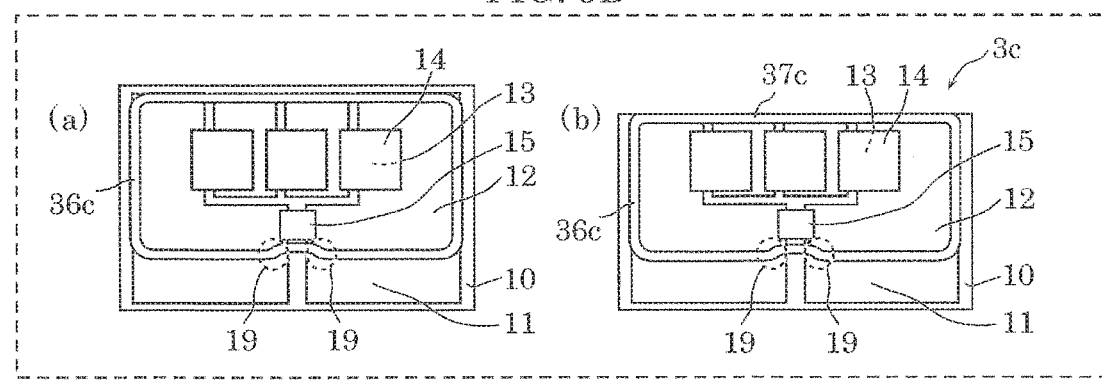
FIG. 9D is a schematic plan view illustrating a light-emitting device including a dam surrounding light-emitting elements and a protective element where only a portion of the dam along the direction parallel to the alignment direction of the light-emitting elements is formed so as to approach the light-emitting elements.

FIGS. 9A to 9D are schematic plan views each illustrating one example of a light-emitting device including a dam surrounding light-emitting elements and a protective element where only a portion of the dam along the direction parallel to the alignment direction of the light-emitting elements is formed so as to approach the light-emitting elements. (a) of FIGS. 9B to 9D illustrates singulation of the light-emitting device in the case where part of the dam is not cut, and (b) of FIGS. 9B to 9D illustrates singulation of the light-emitting device in the case where part of the dam is cut. The configurations of light-emitting devices 3, 3a, 3b, and 3c excluding the dams are similar to those of light-emitting devices 2, 2a, 2b, and 2c illustrated in FIGS. 8A to 8D, and their descriptions will be omitted.

Light-emitting device 3 illustrated in FIG. 9A is a basic configuration of light-emitting devices 3a to 3c illustrated in FIGS. 9B to 9D. Unlike light-emitting device 2 illustrated in FIG. 8A, light-emitting device 3 includes dam 36 formed so as to continuously surround a plurality of light-emitting elements 13 and protective element 15.

In light-emitting device 3a illustrated in (a) of FIG. 9B, dam 36a is disposed along the alignment direction of the group of three aligned light-emitting elements 13 so as to approach one side of the group of light-emitting elements 13 opposite to the side including protective element 15. Dam 36a is disposed so as to approach the one side of protective element 15 disposed opposite to the side including light-emitting elements 13. Dam 36a includes curved portions 19 formed near the corners of light-emitting elements 13 disposed at two ends of the group of three aligned light-emitting elements 13 and near the corners of protective element 15. In light-emitting device 3a illustrated in (b) of FIG. 9B, second dam 37a is formed as a result of cutting off of part of dam 36a during singulation of light-emitting device 3a. The remaining portion of dam 36a other than second dam 37a corresponds to that of the first dam.

In light-emitting device 3b illustrated in (a) of FIG. 9C, dam 36b is aligned along the alignment direction of the group of three aligned light-emitting elements 13 so as to approach only one side of the group of light-emitting elements 13 opposite to the side including protective element 15. Dam 36b includes curved portions 19 formed near the corners of light-emitting elements 13 disposed at two ends of the group of three aligned light-emitting elements 13. In light-emitting device 3b illustrated in (b) of FIG. 9C, second dam 37b is formed as a result of cutting off of part of dam 36b during singulation of light-emitting device 3b. The remaining portion of dam 36b other than second dam 37b corresponds to that of the first dam.

In light-emitting device 3c illustrated in (a) of FIG. 9D, dam 36c is disposed so as to approach only one side of protective element 15 disposed opposite to the side including light-emitting elements 13. Dam 36c includes curved portions 19 formed near the corners of protective element 15. In light-emitting device 3c illustrated in (b) of FIG. 9D, second dam 37c is formed as a result of cutting off of part of dam 36c during singulation of light-emitting device 3c. The remaining portion of dam 36c other than second dam 37c corresponds to that of the first dam.

Curved portions 19 are formed near the corners of the semiconductor elements. In other words, curved portions 19 each have the starting point at a corner of a semiconductor element. During singulation of light-emitting devices 3a, 3b, and 3c illustrated in (b) of FIGS. 9B, 9C, and 9D, dams 36a, 36b, and 36c are cut parallel to the long side direction of the group of light-emitting elements 13 in light-emitting devices 3a, 3b, and 3c, respectively. Accordingly, second dams 37a, 37b, and 37c have a width smaller than those of dams 36a, 36b, and 36c, respectively. Second dams 37a, 37b, and 37c have an approximately flat surface on the lateral sides along the outer peripheries of light-emitting devices 3a, 3b, and 3c, respectively.

[2-4-3. Shape 3]

Figure 10A:
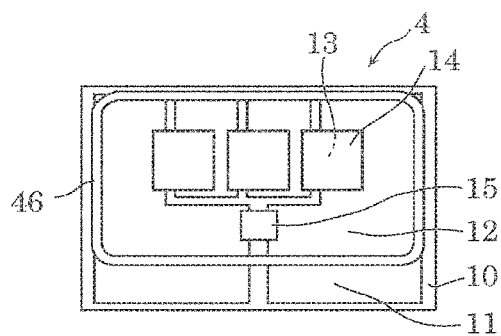
FIG. 10A is a schematic plan view illustrating a light-emitting device including a dam surrounding light-emitting elements and a protective element.
Figure 10B:
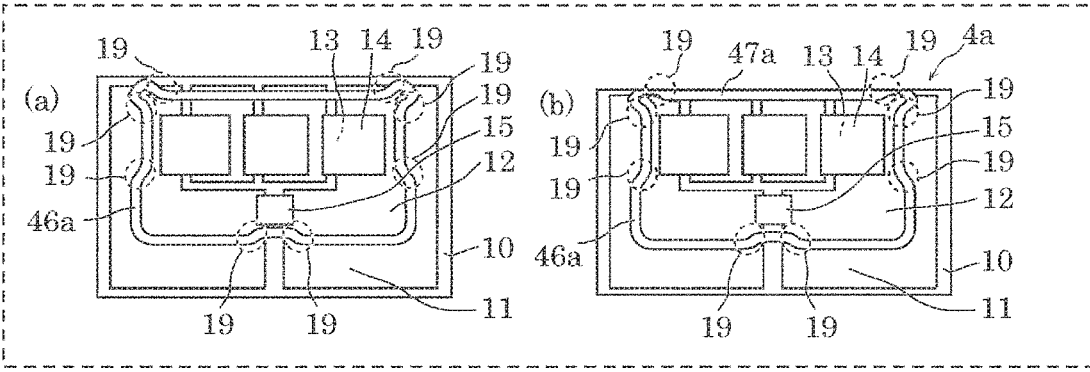
FIG. 10B is a schematic plan view illustrating a light-emitting device including a dam surrounding light-emitting elements and a protective element where portions of the dam along the direction parallel to the alignment direction of the light-emitting elements and the direction intersecting the alignment direction are formed so as to approach these elements.
Figure 10C:
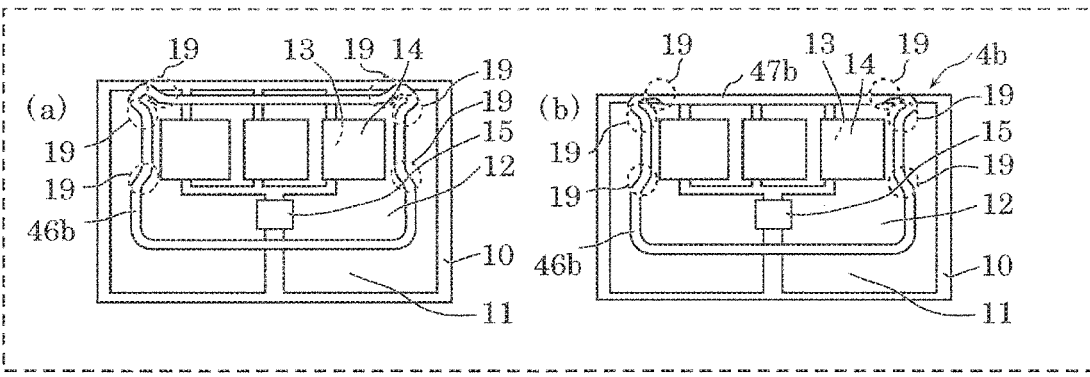
FIG. 10C is a schematic plan view illustrating a light-emitting device including a dam surrounding light-emitting elements and a protective element where portions of the dam along the direction parallel to the alignment direction of the light-emitting elements and the direction intersecting the alignment direction are formed so as to approach these elements.
Figure 10D:
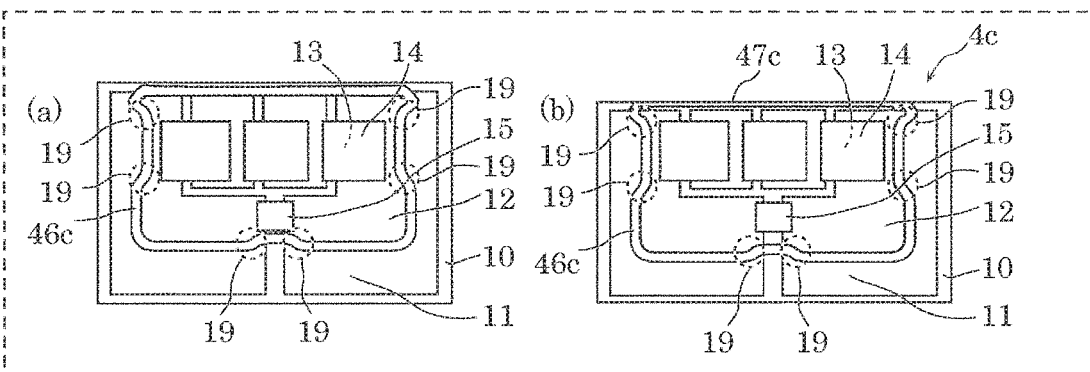
FIG. 10D is a schematic plan view illustrating a light-emitting device including a dam surrounding light-emitting elements and a protective element where portions of the dam along the direction parallel to the alignment direction of the light-emitting elements and the direction intersecting the alignment direction are formed so as to approach these elements.

FIGS. 10A to 10D are schematic plan views illustrating examples of light-emitting devices each including a dam surrounding light-emitting elements and a protective element where portions of the dam along the direction parallel to the alignment direction of the light-emitting elements and the direction intersecting the alignment direction are formed so as to approach these elements. (a) of FIGS. 10B to 10D illustrates singulation of the light-emitting device in the case where part of the dam is not cut, and (b) of FIGS. 10B to 10D illustrates singulation of the light-emitting device in the case where part of the dam is cut. The configurations of light-emitting devices 4, 4a, 4b, and 4c other than the dams are similar to those of light-emitting devices 2, 2a, 2b, and 2c illustrated in FIGS. 8A to 8D, and their descriptions will be omitted.

Light-emitting device 4 illustrated in FIG. 10A is a basic configuration of light-emitting devices 4a to 4c illustrated in FIGS. 10B to 10D. Unlike light-emitting device 2 illustrated in FIG. 8A, light-emitting device 4 includes dam 46 formed so as to continuously surround light-emitting element 13.

In light-emitting device 4a illustrated in (a) of FIG. 10B, dam 46a is disposed along the alignment direction of the group of three aligned light-emitting elements 13 so as to approach one side of the group of light-emitting elements 13 opposite to the side including protective element 15. Dam 46a is disposed along the direction intersecting the alignment direction of the group of three aligned light-emitting elements 13 so as to approach one sides of light-emitting elements 13 disposed at two ends of the group of three aligned light-emitting elements 13. Furthermore, dam 46a is also disposed so as to approach one side of protective element 15 disposed opposite to the side including light-emitting elements 13. Dam 46a includes curved portions 19 formed near the corners of protective element 15 and near the corners of light-emitting elements 13 disposed at two ends of the group of three aligned light-emitting elements 13. In other words, dam 46a is configured to include curved portions 19 in both the long side direction and short side direction of the group of three aligned light-emitting elements 13. In light-emitting device 4a illustrated in (b) of FIG. 10B, second dam 47a is formed as a result of cutting off of part of dam 46a during singulation of light-emitting device 4a. The remaining part of dam 46a excluding second dam 47a corresponds to that of the first dam.

In light-emitting device 4b illustrated in (a) of FIG. 10C, dam 46b is disposed along the alignment direction of the group of three aligned light-emitting elements 13 so as to approach one side of the group of light-emitting elements 13 opposite to the side including protective element 15. Dam 46b is disposed along the direction intersecting the alignment direction of the group of three aligned light-emitting elements 13 so as to approach one sides of light-emitting elements 13 disposed at two ends of the group of three aligned light-emitting elements 13. Dam 46b includes curved portions 19 formed near corners of light-emitting elements 13 disposed at two ends of the group of three aligned light-emitting elements 13. In other words, dam 46b is configured to include curved portions 19 in both the long side direction and short side direction of the group of three aligned light-emitting elements 13. In light-emitting device 4b illustrated in (b) of FIG. 10C, second dam 47b is formed as a result of cutting off of part of dam 46b during singulation of light-emitting device 4b. The remaining portion of dam 46b other than second dam 47b corresponds to that of the first dam.

In light-emitting device 4c illustrated in (a) of FIG. 10D, dam 46c is disposed along the direction intersecting the alignment direction of the group of three aligned light-emitting elements 13 so as to approach one sides of light-emitting elements 13 disposed at two ends of the group of three aligned light-emitting elements 13. Dam 46c is also disposed so as to approach one side of protective element 15 disposed opposite to the side including light-emitting elements 13. Dam 46c includes curved portions 19 formed near the corners of protective element 15 and near corners of light-emitting elements 13 disposed at two ends of the group of three aligned light-emitting elements 13. In light-emitting device 4c illustrated in (b) of FIG. 10D, second dam 47c is formed as a result of cutting off of part of dam 46c during singulation of light-emitting device 4c. The remaining portion of dam 46c other than second dam 47c corresponds to that of the first dam.

Curved portions 19 are formed near the corners of the semiconductor elements. In other words, curved portions 19 each have the starting point at a corner of a semiconductor element. During singulation of light-emitting devices 4a, 4b, and 4c illustrated in (b) of FIGS. 10B, 10C, and 10D, dams 46a, 46b, and 46c are cut parallel to the long side direction of the group of light-emitting elements 13 in light-emitting devices 4a, 4b, and 4c, respectively. For this reason, the second dams in the respective drawings have a width smaller than those of dams 46a, 46b, and 46c, and have an approximately flat surface on the lateral sides along the outer peripheries of light-emitting devices 4a, 4b, and 4c.

[2-4-4. Shape 4]

Figure 11A:
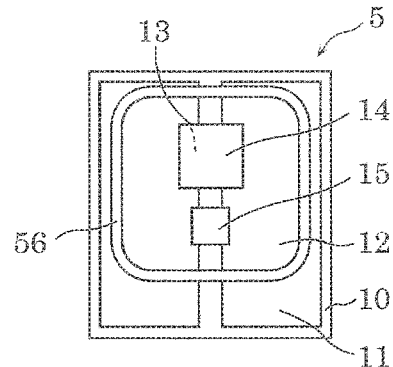
FIG. 11A is a schematic plan view illustrating the shape of a dam corresponding to the dam illustrated in FIG. 9A where one light-emitting element is included.
Figure 11B:
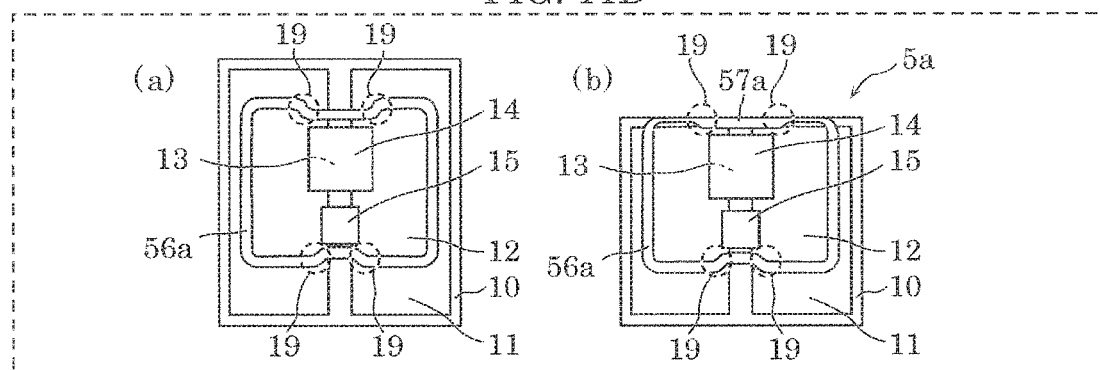
FIG. 11B is a schematic plan view illustrating the shape of a dam corresponding to the dam illustrated in FIG. 9B where one light-emitting element is included.
Figure 11C:
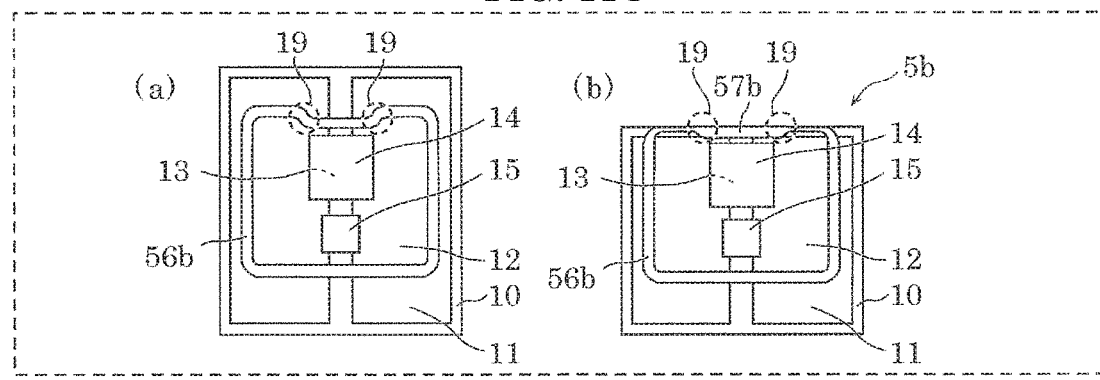
FIG. 11C is a schematic plan view illustrating the shape of a dam corresponding to the dam illustrated in FIG. 9C where one light-emitting element is included.
Figure 11D:
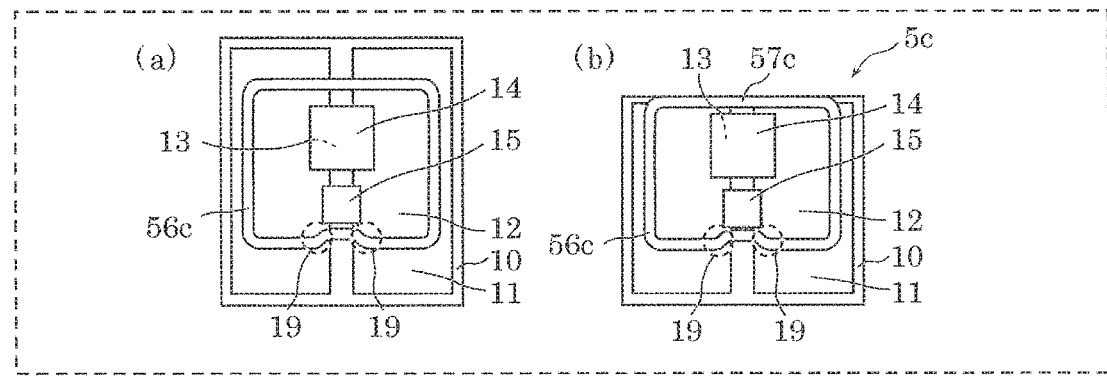
FIG. 11D is a schematic plan view illustrating the shape of a dam corresponding to the dam illustrated in FIG. 9D where one light-emitting element is included.

FIGS. 11A to 11D are schematic plan views each illustrating the shape of a dam corresponding to the dams illustrated in FIGS. 9A to 9D where one light-emitting element 13 is included. (a) of FIGS. 11B to 11D illustrates singulation of the light-emitting device in the case where part of the dam is not cut, and (b) of FIGS. 11B to 11D illustrates singulation of the light-emitting device in the case where part of the dam is cut. The configurations of light-emitting devices 5, 5a, 5b, and 5c other than the dams are similar to those of light-emitting devices 3, 3a, 3b, and 3c illustrated in FIGS. 9A to 9D, respectively, except that one light-emitting element 13 is included, and therefore their descriptions will be omitted.

Light-emitting device 5 illustrated in FIG. 11A is a basic configuration of light-emitting devices 5a to 5c illustrated in FIGS. 11B to 11D. Unlike light-emitting device 3 illustrated in FIG. 9A, light-emitting device 5 includes dam 56 formed so as to continuously surround one light-emitting element 13 and protective element 15.

In light-emitting device 5a illustrated in (a) of FIG. 11B, dam 56a is disposed so as to approach one side of light-emitting element 13 opposite to the side including protective element 15. Dam 56a is also disposed so as to approach one side of protective element 15 disposed opposite to the side including light-emitting element 13. Dam 56a includes curved portions 19 formed near the corners of light-emitting element 13 opposite to the side including protective element 15 and near the corners of protective element 15 disposed opposite to the side including light-emitting element 13. In light-emitting device 5a illustrated in (b) of FIG. 11B, second dam 57a is formed as a result of cutting off of part of dam 56a during singulation of light-emitting device 5a. The remaining portion of dam 56a other than second dam 57a corresponds to that of the first dam.

In light-emitting device 5b illustrated in (a) of FIG. 11C, dam 56b is disposed so as to approach only one side of light-emitting element 13 opposite to the side including protective element 15. Dam 56b includes curved portions 19 near the corners of light-emitting element 13 opposite to the side including protective element 15. In light-emitting device 5b illustrated in (b) of FIG. 11C, second dam 57b is formed as a result of cutting off of part of dam 56b during singulation of light-emitting device 5b. The remaining portion of dam 56b other than second dam 57b corresponds to that of the first dam.

In light-emitting device 5c illustrated in (a) of FIG. 11D, dam 56c is disposed so as to approach only one side of protective element 15 disposed opposite to the side including light-emitting element 13. Dam 56c includes curved portions 19 formed near the corners of protective element 15 disposed opposite to the side including light-emitting element 13. In light-emitting device 5c illustrated in (b) of FIG. 11D, second dam 57c is formed as a result of cutting off of part of dam 56c during singulation of light-emitting device 5c. The remaining portion of dam 56c other than second dam 57c corresponds to that of the first dam.

Curved portions 19 are formed near the corners of the semiconductor elements. In other words, curved portions 19 each have the starting point at a corner of a semiconductor element. During singulation of light-emitting devices 5a, 5b, and 5c illustrated in (b) of FIGS. 11B, 11C, and 11D, dams 56a, 56b, and 56c are cut parallel to the outer peripheries of light-emitting devices 5a, 5b, and 5c, respectively. For this reason, second dams 57a, 57b, and 57c have a width smaller than those of dams 56a, 56b, and 56c, and have an approximately flat surface on the lateral sides along the outer peripheries of light-emitting devices 5a, 5b, and 5c, respectively.

[2-4-5. Shape 5]

Figure 12A:
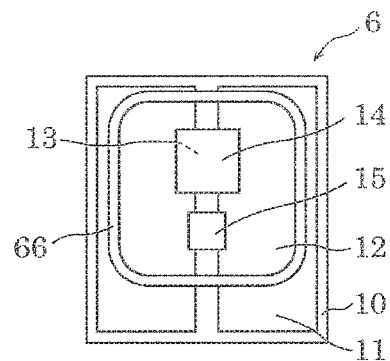
FIG. 12A is a schematic plan view illustrating the shape of a dam corresponding to the dam illustrated in FIG. 10A where one light-emitting element is included.
Figure 12B:
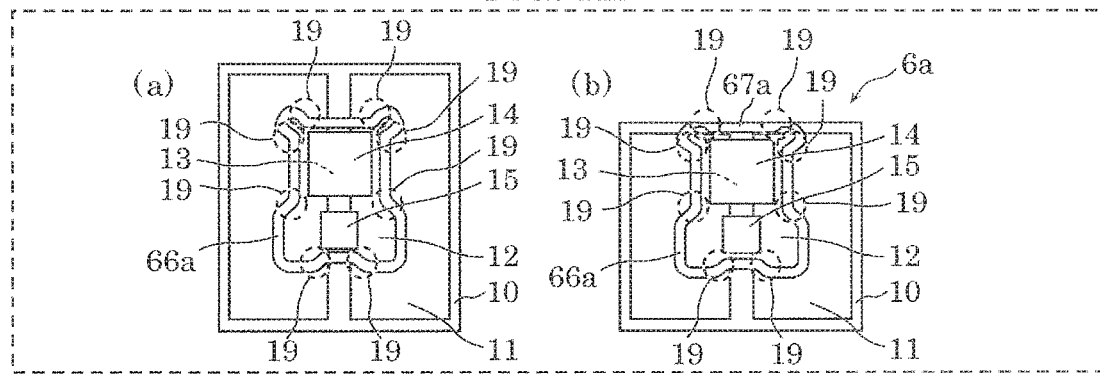
FIG. 12B is a schematic plan view illustrating the shape of a dam corresponding to the dam illustrated in FIG. 10B where one light-emitting element is included.
Figure 12C:
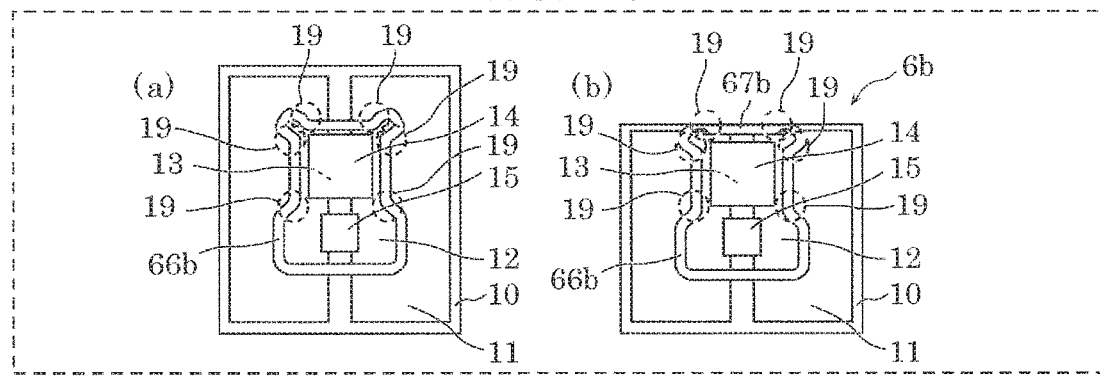
FIG. 12C is a schematic plan view illustrating the shape of a dam corresponding to the dam illustrated in FIG. 10C where one light-emitting element is included.
Figure 12D:
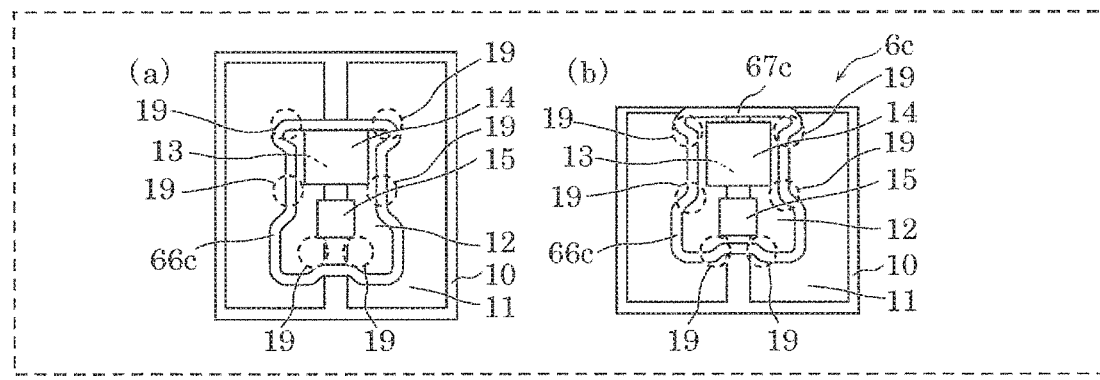
FIG. 12D is a schematic plan view illustrating the shape of a dam corresponding to the dam illustrated in FIG. 10D where one light-emitting element is included.

FIGS. 12A to 12D are schematic plan views illustrating the shapes of the dams corresponding to those illustrated in FIGS. 10A to 10D, respectively, where one light-emitting element 13 is included. (a) of FIGS. 12B to 12D illustrates singulation of the light-emitting device in the case where part of the dam is not cut, and (b) of FIGS. 12B to 12D illustrates singulation of the light-emitting device in the case where part of the dam is cut. The configurations of light-emitting devices 6, 6a, 6b, and 6c excluding the dams are similar to those of light-emitting devices 4, 4a, 4b, and 4c illustrated in FIGS. 10A to 10D, respectively, except that only one light-emitting element 13 is included, and therefore their descriptions will be omitted.

Light-emitting device 6 illustrated in FIG. 12A is a basic configuration of light-emitting devices 6a to 6c illustrated in FIGS. 12B to 12D. Unlike light-emitting device 4 illustrated in FIG. 10A, light-emitting device 6 includes dam 66 formed so as to continuously surround one light-emitting element 13 and protective element 15.

In light-emitting device 6a illustrated in (a) of FIG. 12B, dam 66a is disposed so as to approach three sides of light-emitting element 13 not facing the side including protective element 15. Dam 66a is also disposed so as to approach one side of protective element 15 disposed opposite to the side including light-emitting elements 13. Dam 66a includes curved portions 19 formed near the corners of light-emitting element 13 and near the corners of protective element 15 disposed opposite to the side including light-emitting element 13. In light-emitting device 6a illustrated in (b) of FIG. 12B, second dam 67a is formed as a result of cutting off of part of dam 66a during singulation of light-emitting device 6a. The remaining portion of dam 66a other than second dam 67a corresponds to that of the first dam.

In light-emitting device 6b illustrated in (a) of FIG. 12C, dam 66b is disposed so as to approach the three sides of light-emitting element 13 not facing the side including protective element 15. Dam 66b includes curved portions 19 formed near the corners of light-emitting element 13. In light-emitting device 6b illustrated in (b) of FIG. 12C, second dam 67b is formed as a result of cutting off of part of dam 66b during singulation of light-emitting device 6b. The remaining portion of dam 66b other than second dam 67b corresponds to that of the first dam.

In light-emitting device 6c illustrated in (a) of FIG. 12D, dam 66c is disposed so as to approach two sides of light-emitting element 13 excluding the side including protective element 15 and the side including protective element 15. Dam 66c is also disposed so as to approach one side of protective element 15 disposed opposite to the side including light-emitting element 13. Dam 66c includes curved portions 19 formed near the corners of light-emitting element 13 and near the corners of protective element 15 disposed opposite to the side including light-emitting element 13. In light-emitting device 6c illustrated in (b) of FIG. 12D, second dam 67c is formed as a result of cutting off of part of dam 66c during singulation of light-emitting device 6c. The remaining portion of dam 66c other than second dam 67c corresponds to that of the first dam.

Curved portions 19 are formed near the corners of the semiconductor elements. In other words, curved portions 19 each have the starting point at a corner of a semiconductor element. During singulation of light-emitting devices 6a, 6b, and 6c illustrated in (b) of FIGS. 12B, 12C, and 12D, dams 66a, 66b, and 66c are cut parallel to the lateral direction of light-emitting element 13 in light-emitting devices 6a, 6b, and 6c, respectively. For this reason, second dams 67a, 67b, and 67c have a width smaller than those of first dams 66a, 66b, and 66c, and have an approximately flat surface on the lateral sides along the outer peripheries of light-emitting devices 6a, 6b, and 6c, respectively.

[2-4-6. Other Shapes]

As illustrated in Shapes 1 to 5 described above, curved portions 19 disposed in the dam near the semiconductor element reduce the distance between the dam portions on the opposite sides of the region including light-emitting element 13, compared to the distance between the dam portions on the opposite sides of the region not including light-emitting element 13. Such a configuration can achieve a light-emitting device having a sharp near-field pattern of light emission.

As illustrated in (b) of FIGS. 8A to 8D, 9B to 9D, 10B to 10D, 11B to 11D, and 12B to 12D, part of the dam on the side of light-emitting element 13 may be cut off from mount substrate 10 before singulation. Through the cutting step, the second dam may have a lateral surface flush with the end surface of mount substrate 10. The singulation method for the light-emitting device will be described later.

Figure 13A:
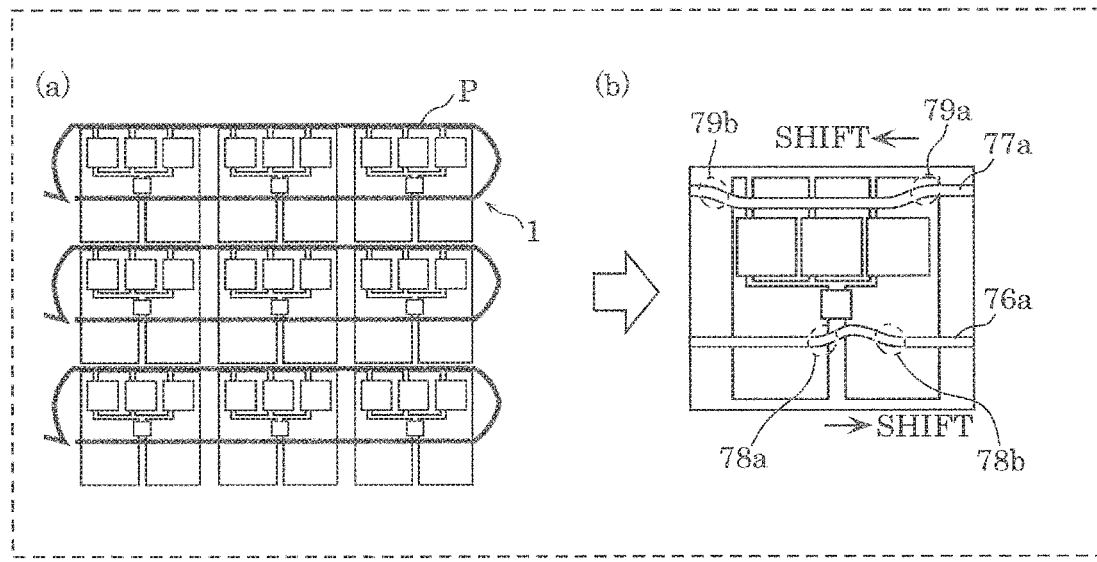
FIG. 13A is a diagram illustrating an arrangement of a dam forming material during formation of a dam across a plurality of light-emitting devices.
Figure 13B:
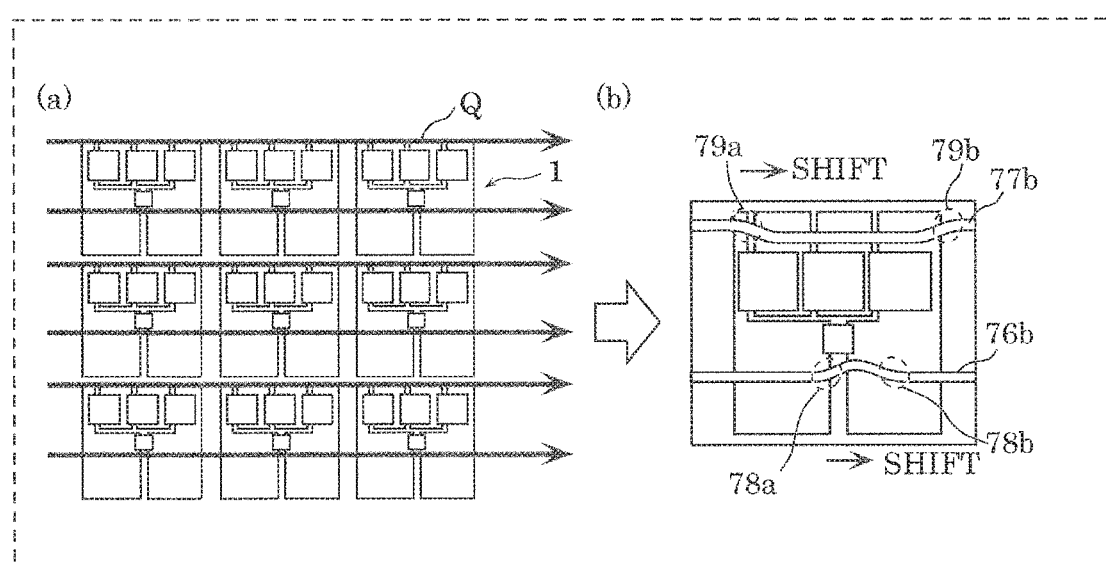
FIG. 13B is a diagram illustrating another arrangement of a dam forming material during formation of a dam across a plurality of light-emitting devices.

FIGS. 13A and 13B are diagrams each illustrating an arrangement of a dam forming material in formation of a dam across a plurality of light-emitting devices.

As illustrated in FIGS. 13A and 13B, curved portions 79a and 79b or 78a and 78b may be asymmetrically formed near the two ends of the group of aligned light-emitting elements 13 or near the two ends of protective element 15. In this specification, the term "asymmetrically" means that two curved portions of a dam are not positioned in an equal distance from the center line in the alignment direction of light-emitting element 13 or the center line of protective element 15.

For example, in (a) of FIG. 13A, a dam forming material is applied so as to surround light-emitting elements 13 and protective elements 15 in the same column in a plurality of light-emitting devices 1. In other words, as illustrated by arrow P in (a) of FIG. 13A, the application direction of the dam forming material in one light-emitting device 1 is different between the side near light-emitting element 13 and the side near protective element 15. In this case, as illustrated in (b) of FIG. 13A, in one light-emitting device 1, the arrangement positions of curved portions 78a and 78b of first dam 76a are shifted in the direction different from those of curved portions 79a and 79b of second dam 77a.

In contrast, in (a) of FIG. 13B, the dam forming material is applied to portions near light-emitting elements 13 and portions near protective element 15 in a plurality of light-emitting devices 1 disposed in the same row. At this time, as illustrated by arrow Q in (a) of FIG. 13B, the application direction of the dam forming material is the same in the portions near light-emitting elements 13 and those near protective element 15. In this case, as illustrated in (b) of FIG. 13B, the arrangement positions of curved portions 78a and 78b of first dam 76a and those of curved portions 79a and 79b of second dam 77a are shifted in the same direction in one light-emitting device 1.

In the dispensing method, in the case where a nozzle starts to feed the dam forming material from a position away from the semiconductor element, the dam forming material is applied straight in the traveling direction of the nozzle in the portion away from the semiconductor element. When the nozzle reaches a position adjacent to the semiconductor element, the dam forming material receives an electrostatic force, and is applied onto mount substrate 10 in a portion close to the semiconductor element. When the nozzle again feeds the dam forming material in a position away from semiconductor element, the dam forming material no longer receives the electrostatic force from the semiconductor element. Accordingly, the dam forming material is again applied straight in the traveling direction of the nozzle to asymmetrically form curved portions 78a and 78b of first dam 76a and curved portions 79a and 79b of second dam 77a. The positions of curved portions 78a and 78b of first dam 76a and curved portions 79a and 79b of second dam 77a in the semiconductor element can be adjusted through control of the application speed of the dam forming material.

The method of applying the dam forming material will be described later in detail.

[2-5. Configuration of Cut Surface of Dam Generated by Singulation of Light-emitting Device]

As described above, individual light-emitting devices 1 are usually produced as follows: Light-emitting elements 13, light-transmissive members 14, reflective member 18, and the dam for a plurality of light-emitting devices 1 are disposed on a large mount substrate 10, and mount substrate 10 is diced with a dicing blade for singulation. The details of the singulation method will be described later.

As described later, singulation is performed by applying the dicing blade so as to remove a portion of second dam 17 disposed opposite to the side including light-emitting element 13. Thereby, second dam 17 has a vertical surface flush with the end surface of mount substrate 10 as illustrated in (a) of FIG. 1. Second resin dam 17a is exposed from the cut surface of second dam 17 after singulation, and second surface layer 17b is present only on the upper portion of second dam 17 on this side. Second surface layer 17b is also present on the surface of second dam 17 on the side of light-emitting element 13. In the case where second surface layer 17b in contact with reflective member 18 is taken into reflective member 18 during formation of reflective member 18, second surface layer 17b may be formed only near the vertex portion of second dam 17 not contacting reflective member 18.

Reflective member 18 should be disposed around light-emitting elements 13 without gaps using a resin having low viscosity as a reflective member forming material. Because the reflective member forming material ejected onto mount substrate 10 spreads over mount substrate 10, a surrounding dam or frame is needed in order to spread the reflective member forming material over only desired regions of mount substrate 10 (not to spread the reflective member forming material over undesired regions). Because the AlN substrate used as mount substrate 10 is expensive, it is desired that the area of light-emitting device 1 be minimized to reduce the amount of the AlN substrate to be used in production of the light-emitting device. There is a positive correlation between the viscosity of a resin and the mechanical hardness of the resin after heat curing. For this reason, defects of reflective member 18 generated during the production step of light-emitting device 1 can be reduced by cutting hard second dam 17 formed of a dam forming material having high viscosity rather than reflective member 18 formed of a reflective member forming material having low viscosity. Furthermore, the durability of light-emitting device 1 itself can be improved. Dicing can be performed at a position immediately adjacent to the outer side of second dam 17 formed of a hard resin or the inner side of the position such that second resin dam 17a formed of a hard resin is left, eliminating problems related to area and strength of light-emitting device 1.

[3. Method of Producing Light-Emitting Device]

A method of producing a light-emitting device will now be described.

[3-1. Preparation of Mount Substrate to Mounting of Protective Element]

Mount substrate 10 (submount) having a conductive pattern formed thereon is first prepared. A calcined AlN substrate is used as mount substrate 10, for example. A conductive pattern is formed in the form of a matrix on mount substrate 10 by plating. The conductive pattern corresponds to extraction electrodes 11 and wiring electrodes 12 to be formed in the subsequent step. A metal pad for connecting light-emitting element 13 is formed on the conductive pattern (see FIG. 1).

In one light-emitting device 1 including a large number of light-emitting elements 13, a conductive pattern may be appropriately formed such that light-emitting elements 13 can be flip-chip connected in series or in parallel. Although FIG. 1 illustrates light-emitting device 1 including three light-emitting elements 13 connected in series, the shape of the metal pad may be designed to allow connection to the p-type electrode and the n-type electrode of light-emitting element (LED) 13 with bumps, for example. Although the actual conductive pattern of mount substrate 10 has a complicated shape according to the electrode pattern of light-emitting element 13, its simplified shape is illustrated in the light-emitting device according to the present embodiment. A conductive pattern illustrated in FIG. 11A may be formed, for example, in one light-emitting device 1 including one light-emitting element 13.

In the next step, protective element 15 is connected to wiring electrodes 12. Protective element 15 is placed on the metal bump by a flip chip process, and is connected to the conductive pattern by ultrasonic welding. Protective element 15 is connected to the conductive pattern in parallel to light-emitting element 13, for example.

[3-2. Mounting of Light-emitting Element]

In the next step, light-emitting element 13 is mounted on mount substrate 10.

Light-emitting element 13 to be mounted is a blue LED chip including a GaN substrate and a nitride compound semiconductor formed thereon. A plurality of metal bumps is placed on the metal pad. Light-emitting element 13 is placed on the growth side of the substrate by the flip chip process, and is connected to the metal pad through ultrasonic welding.

The growth substrate may have a microtexture structure on its rear surface (top surface of the mounted element). To form a rough rear surface of the growth substrate, fine irregularities are formed by a process such as etching or blasting or a process using a laser or a dicing blade. In the case where the growth substrate used is a sapphire substrate having a refractive index lower than that of a GaN substrate, the growth substrate may have a flat rear surface.

[3-3. Bonding of Light-Transmissive Member]

In the next step, light-transmissive member 14 is bonded onto light-emitting element 13.

A predetermined amount of an adhesive transparent resin is first applied onto the central portion of the rear surface of the growth substrate in light-emitting element 13 with a dispenser. The transparent resin is a silicone resin, for example. Light-transmissive member 14 is then placed on the transparent resin, and pressure is applied to the workpiece from above such that the transparent resin completely covers the top surface of light-emitting element 13. The workpiece is then heated in an oven at 150° C. for three hours to cure the transparent resin.

The transparent resin is applied by the dispensing method. Besides, any method such as a stamp method may also be used.

[3-4. Formation of Dam]

In the next step, a dam is formed on mount substrate 10.

Mount substrate 10 including light-emitting element 13 and light-transmissive member 14 is supported on a stage set at a temperature approximately identical to the gelation temperature of the dam forming material. At this time, the temperature of the stage is, for example, in the range of the temperature 5° C. lower than the gelation temperature of the dam forming material to the temperature 10° C. higher than the gelation temperature of the dam forming material. At a temperature of the stage within this range, the width of the lower end of first surface layer 16b (horizontal distance from the surface of the lower end of first resin dam 16a to the end of the outer surface of first surface layer 16b on mount substrate 10 illustrated in FIG. 6 described later) can be controlled to be 40 nm or less, for example. The temperature of the stage will be described in detail later.

A paste of dam forming material is then applied in the form of a narrow line onto a predetermined position on mount substrate 10 having a predetermined temperature. The dam forming material is a silicone resin containing a dispersed light-reflective material, such as titanium oxide ($TiO_2$) particles. As a structural requirement for the dam, the dam should have a large height. In the dispensing method, a dam forming material having high viscosity may be used in formation of narrow lines having a large height whereas a dam forming material having excessively high viscosity is difficult to eject from the nozzle. Accordingly, the viscosity of the dam forming material may be set at a viscosity similar to a tooth paste such that the shape of the material does not change much after application.

As illustrated in FIGS. 13A and 13B, the dam forming material is applied in the width of about 200 μm so as to surround each row of light-transmissive members 14 and protective elements 15 in mount substrate 10 by the dispensing method. At this time, because the light-emitting devices are prepared in the form of a matrix on mount substrate 10, each row or column of light-transmissive members 14 and protective elements 15 may be surrounded. The dam forming material serves as a dam to prevent the reflective member forming material from flowing into portions around light-emitting element 13 (side of extraction electrode 11) during injection of the reflective member forming material, and may be applied into a closed curve illustrated in (a) of FIG. 13A.

The application pattern can be any pattern other than the closed curve. As illustrated in FIGS. 9A to 12D, each group of light-emitting elements 13 disposed in the form of a matrix may be surrounded in each of light-emitting devices. Alternatively, as illustrated in (a) of FIG. 13B, application of a pattern in the form of a lattice with a large number of nozzles can also be contemplated.

In the next, mount substrate 10 including the dam forming material applied into a line is heated to thermally cure the paste of dam forming material. The heating operation during thermal curing is performed at a temperature about 50° C. higher than the gelation temperature of the dam forming material, for example. The temperature during thermal curing will be described in detail later.

First dam 16 and second dam 17 are thereby completed. At the same time, the resin layers containing no light-reflective material, i.e., first surface layer 16b and second surface layer 17b are formed on the surfaces of first dam 16 and second dam 17, respectively. The positional relation among the dam, light-emitting element 13, and protective element 15 will be described in detail later.

Extraction electrode 11 on the submount should be disposed on the outside of the dam because the spaces within the dam are filled with the material for forming reflective member 18. Accordingly, as illustrated in (a) of FIG. 1, a narrow line extends across the conductive pattern on mount substrate 10, and the conductive pattern disposed on the side opposite to the side including light-emitting element 13 and protective element 15 is formed as extraction electrode 11. The conductive pattern disposed on the same side as that including light-emitting element 13 and protective element 15 is formed as wiring electrode 12.

The temperature of the stage during application of the dam forming material onto mount substrate 10 and the temperature for thermally heating the dam will now be described by way of experimental examples. Table 1 summarizes the ratio (H/Wc) of the length to the width of the resin dam including the surface layer while the temperature of the stage is varied, and the ratio (Wb/Wc) to the bottom width to the maximum width of the resin dam including the surface layer.

In the application of the dam forming material, the temperature of the stage supporting the mount substrate 10 (=temperature of mount substrate 10) was set at a temperature substantially equal to or higher than the gelation temperature of the dam forming material. The dam was formed around the periphery of light-emitting devices 1 disposed in the form of a matrix, and mount substrate 10 was heated in an oven at 150° C. for three hours to thermally cure the dam.

The cross-section of the dam in the resulting workpiece was observed with an SEM. A heterogeneous layer (hereinafter, referred to as first surface layer 16b) was formed on the surface of first dam 16 as illustrated in FIG. 4. The breadth of the lower end of first surface layer 16b was 40 nm or less seen from the lower corner of first resin dam 16a. Second dam 17 was similar to first dam 16, and their descriptions will be omitted. In the conventional method of setting the temperature of the stage at room temperature, the surface layer was also present as illustrated in FIG. 5. In this case, the breadth of the lower end of the surface layer was more than 40 nm seen from the lower corner of the resin dam.

Table 1 shows that the resulting dam had a ratio H/Wc of 0.86 (ratio of the length to the width of the resin dam including the surface layer) in the case where the temperature of the stage was equal to the gelation temperature of the dam forming material. In contrast, the dam had a ratio H/Wc of 0.71 in the case where the temperature of the stage was room temperature.

Table 1 shows that the ratio (Wb/Wc) of the bottom width to the maximum width of the resin dam including the surface layer was 0.96 in the case where the temperature of the stage was equal to the gelation temperature of the dam forming material. In contrast, the ratio Wb/Wc was 0.94 in the case where the temperature of the stage was room temperature. Accordingly, it is believed that the ratio Wb/Wc is more than 0.94 in the case where the temperature of the stage is higher than the gelation temperature of the dam forming material.

Furthermore, as illustrated in FIG. 7, the bonding strength (shear strength) of the dam was an average of 465 g/mm$^2$ in the case where the temperature of the stage was substantially equal to the gelation temperature of the dam forming material. The average in this case was 1.3 times the average (358 g/mm$^2$) in the case where the temperature of the stage was room temperature (or was 30% increased). The shear strength of the dam was measured with BONDING TESTER (made by RHESCA Co., Ltd.) PTR-1100 with a probe for 5 kg at a locate amount of 2.0 μm, a moving rate of 0.1 mm/s, and a moving distance of 1.5 mm.

A variety of dam forming materials were used. The same effect was obtained using any resin allowing an increase in mechanical strength after curing, such as silicone resins containing TiO$_2$ nanoparticles, those containing carbon particles, and those containing dispersed fumed silica.

TABLE 1

| Temperature of Stage | H/Wc | Wb/Wc |
| --- | --- | --- |
| Room Temperature | 0.71 | 0.94 |
| Gelation Temperature−5° C. | 0.85 | 0.97 |
| Gelation Temperature | 0.86 | 0.96 |
| Gelation Temperature +5° C. | 0.81 | 1.00 |
| Gelation Temperature +10° C. | 0.77 | 0.99 |

The positional relation between the dam and the semiconductor elements (light-emitting element 13 and protective element 15) will now be described by way of experimental examples.

The dam forming material was applied while the distance from the edge of the semiconductor element to the edge of the dam forming material was set at 0.10 mm. Specifically, as illustrated in FIG. 13A, a plurality of light-emitting devices was surrounded with the dam forming material in one application operation. The diameter of the dam forming material applied onto mount substrate 10 was 0.20 mm. As a result, the minimum gap between semiconductor element and the dam was about 0.05 mm in the portions adjacent to the semiconductor element, which indicates that a shift of about ½ from the setting value of 0.10 mm was generated.

As illustrated in (b) of FIG. 13A and (b) of FIG. 13B, the shift started from the position facing the end of the semiconductor element which the dam forming material approached in the traveling direction of the dam forming material which was being applied, and started from the position facing the end of the semiconductor element from which the dam forming material traveled away the semiconductor element. In other words, it turned out that the regions of the dam curved so as to approach the semiconductor element are readily shifted to the traveling direction of the dam forming material which is being applied. The direction of the shift visually observed may be opposite to the direction illustrated according to a variation of the application pattern of the dam forming material.

The degree of shift was varied according to the application rate, the diameter of the nozzle ejecting the dam forming material, the viscosity of the dam forming material, the resin and the light-reflective material contained in the dam forming material, and the distance from the object to the nozzle. In some examples, no apparent shift was observed after curing of the dam forming material.

In the case where individual light-emitting devices were surrounded with the dam forming material one by one, the planar shape of the dam and the arrangement position thereof were varied as illustrated in FIGS. 11A to 12D because the resin dam was disposed adjacent to the lateral surface of light-emitting element 13 in some cases.

[3-5. Formation of Reflective Member]

In the next step, reflective member 18 is formed between the dam and the semiconductor element.

After the formation of the dam, a reflective member forming material is injected into the spaces between the semiconductor element and the dam. The reflective member forming material used is a reflective silicone resin having low viscosity, for example. The reflective member forming material is completely spread into the spaces between the semiconductor element and the dam, and the surface of the reflective member forming material flattens. Mount substrate 10 is then heated in an oven to cure the reflective member forming material. The reflective member forming material is cured at 150° C. for three hours, for example. Reflective member 18 is thereby finished.

As illustrated in FIG. 1, reflective member 18 is a region on mount substrate 10 including light-emitting element 13, and is formed so as to surround the bottom surface and lateral surfaces of light-emitting element 13, the transparent resin, and light-transmissive member 14.

The reflective member forming material can be any resin other than the silicone resin, for example, a liquid transparent medium having low viscosity and containing a resin (such as an acrylic resin, a polyimide resin, a urea resin, or a fluorinated resin) or glass as a main component and a powdery light-reflective material dispersed therein. The light-reflective material to be used may be particles of titanium oxide or zinc oxide, for example. Reflective member 18 can be formed through curing of a liquid resin containing a light-reflective material and a dispersant. In the case where a liquid resin or glass containing a powdery titanium oxide and a dispersant is cured, reflective member 18 can have a reflective function while keeping insulation properties.

In the case where an opaque object (reflective member 18) is disposed very near light-emitting element 13, a sharp light emission edge is achieved in the near-field pattern of light emission. As a result, sharp light distribution is achieved in a light-emitting device integrated into a system using an optical system. This technique is useful in low beams of head lamps of vehicles.

During the formation of the dam, first surface layer 16b and second surface layer 17b are formed on both of the inner lateral surfaces of first dam 16 and second dam 17 on the side including light-emitting element 13 and the outer lateral surfaces of first dam 16 and second dam 17, respectively. After the formation of the dam, first surface layer 16b and second surface layer 17b on the lateral surfaces in contact with reflective member 18 may be taken into reflective member 18 as a result of thermal curing of the reflective member forming material filled into the spaces surrounding light-emitting element 13.

[3-6. Singulation of Light-emitting Device]

Finally, light-emitting devices 1 disposed on mount substrate 10 in the form of a matrix are singulated or separated (diced) into individual light-emitting devices 1. The separation operation is performed using a rotary grinding wheel (dicing blade 80), for example.

Dicing blade 80 having a width of about 100 to 150 μm is often used in cutting of hard objects, such as AlN.

Figure 14:
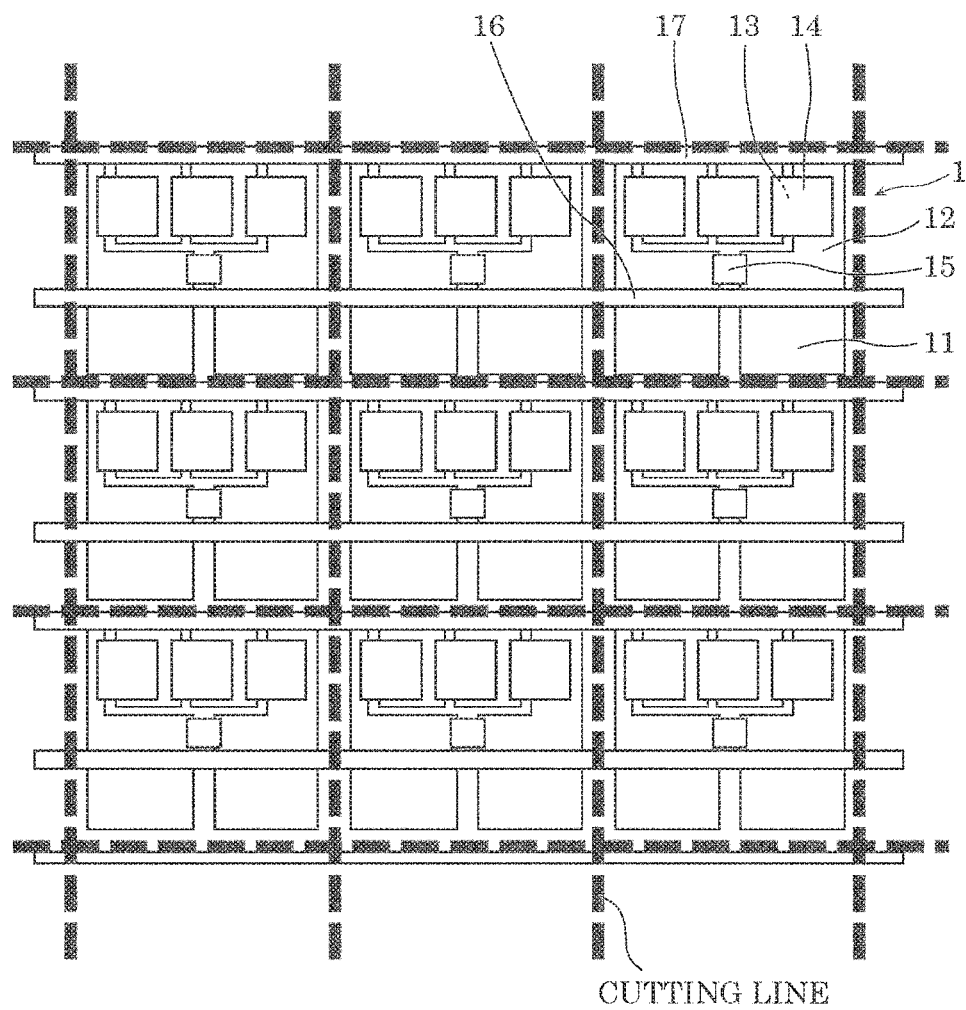
FIG. 14 is a schematic top view illustrating the dicing position corresponding to the light-emitting element in FIG. 8A in a mount substrate including a plurality of light-emitting devices formed thereon.
Figure 15A:
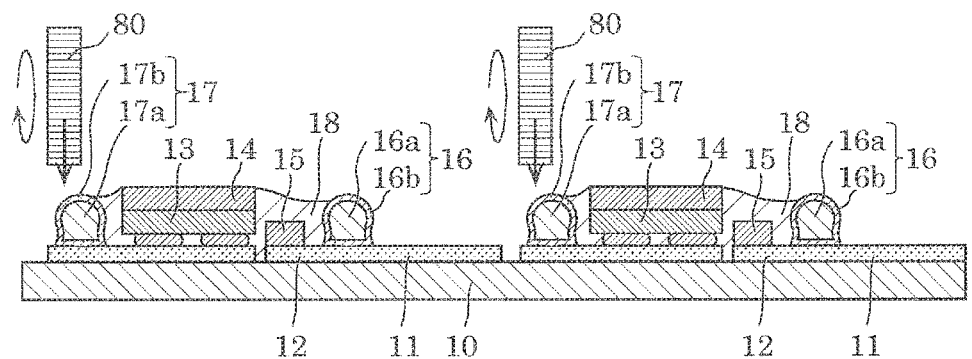
FIG. 15A is a schematic cross-sectional view illustrating a process of dicing a mount substrate including a plurality of light-emitting devices formed thereon.
Figure 15B:
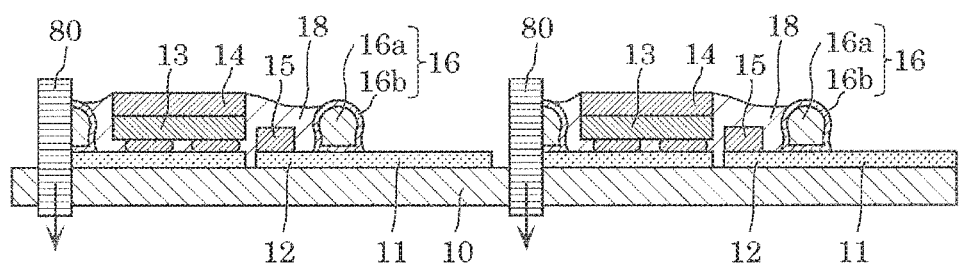
FIG. 15B is a schematic cross-sectional view illustrating a process of dicing a mount substrate including a plurality of light-emitting devices formed thereon.
Figure 15C:
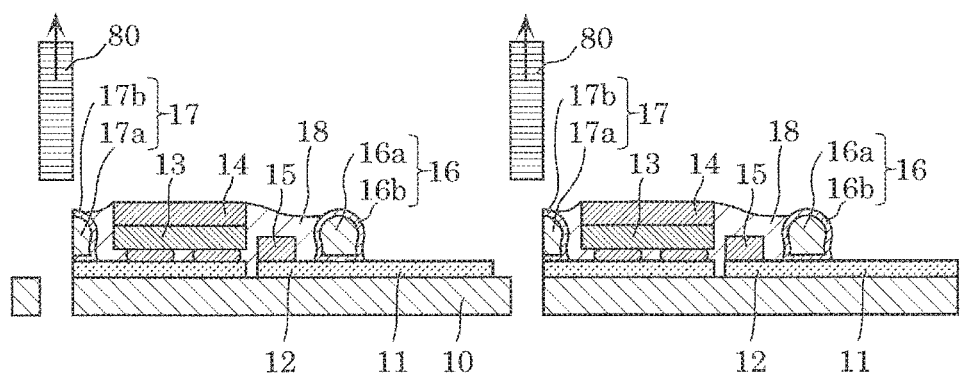
FIG. 15C is a schematic cross-sectional view illustrating a process of dicing a mount substrate including a plurality of light-emitting devices formed thereon.

FIG. 14 is a schematic top view illustrating a dicing position in mount substrate 10 including a plurality of light-emitting devices 1. FIGS. 15A to 15C are schematic cross-sectional views illustrating the steps of dicing mount substrate 10 including a plurality of light-emitting devices 1 in the column direction.

As illustrated in FIG. 14, wiring electrodes 12 in light-emitting device 1 are connected to light-emitting elements 13. Specifically, the n-electrode and the p-electrode (not illustrated) of light-emitting element 13 are connected through metal bumps to the metal pad formed on wiring electrodes 12. As illustrated in FIGS. 14 and 15A to 15C, two adjacent light-emitting devices 1 are disposed such that second dam 17 on the side of light-emitting element 13 is adjacent to first dam 16 on the side of extraction electrode 11.

Such a plurality of light-emitting devices 1 disposed before singulation is cut into individual light-emitting devices 1 with rotary dicing blade 80. As indicated by the cutting line in FIG. 14, mount substrate 10 is cut in the column direction and the row direction of the matrix of a plurality of light-emitting devices 1 disposed on mount substrate 10. During the cutting in the row direction, dicing blade 80 is moved between the portion near the center of second dam 17 and the lateral surface of second dam 17 opposite to light-emitting element 13 in the direction of second dam 17 extending. During the cutting in the column direction, dicing blade 80 is moved so as to alternately cut first dam 16 and second dam 17 in the plurality of light-emitting elements 13.

In the case where dicing blade 80 has a width of 100 μm and second dam 17 has a width of about 200 μm, a portion from the center of second dam 17 to the edge of the portion of second dam 17 disposed opposite to light-emitting element 13 is removed through the cutting in the row direction.

As illustrated in FIG. 15A, dicing blade 80 is first applied between the portion near the center of second dam 17 and the lateral surface of second dam 17 opposite to light-emitting element 13. While dicing blade 80 is rotated, as illustrated in FIG. 15B, second dam 17, wiring electrode 12, and mount substrate 10 are cut. At this time, while dicing blade 80 is being moved in the direction of second dam 17 extending, the workpiece is linearly cut in the positions between light-emitting devices 1.

As illustrated in FIG. 15C, second dam 17 thereby has a surface vertical to and flush with the end surface of mount substrate 10. The exposed surface of second dam 17 is the cut surface of second resin dam 17a. Second surface layer 17b is formed only on the vertex portion of second dam 17 and is not present on the cut surface. On the surface of second dam 17 on the side of light-emitting element 13, second surface layer 17b is formed between reflective member 18 and the second dam 17 on the side of light-emitting element 13. In the case where the surface layer of the inner lateral surface of second dam 17 in contact with reflective member 18 is taken into reflective member 18, second surface layer 17b may be formed only on the vertex portion of second dam 17 not contacting reflective member 18.

Because high-power light-emitting element 13 generates a large amount of heat, a calcined AlN substrate having high thermal conductivity is often used as a material for mount substrate 10. Unfortunately, AlN is expensive, and an amount thereof to be used should be reduced. In the present embodiment, to cut out as many light-emitting devices 1 as possible from an AlN mount substrate 10, the cutting position is designed such that useless portions are not generated on the outer side of the cutting portion. In other words, as illustrated in FIGS. 15A to 15C, the plurality of light-emitting devices 1 is separated for singulation so as to match the outer edge of second dam 17 with the outer edge of dicing blade 80. Such a method can remove part of second dam 17, reducing the amount of AlN mount substrate 10 to be used in production of the light-emitting device.

In the method, in the case where second dam 17 has a width of about 200 μm, second dam 17 having a width of 100 μm is present on the side of light-emitting element 13 even after the cutting. Considering cutting errors, it is believed that second dam 17 having a width of about 50 μm is present even after the cutting. In other words, in the case where the width of second dam 17 before partial removal thereof (i.e., first dam 16) is defined as Wc1, the width Wc2 of second dam 17 after the partial removal satisfies the relation represented by ¼ of Wc1<Wc2<½ of Wc1. Such a width of second dam 17 can enhance the mechanical strength of light-emitting device 1 and the durability of light-emitting device 1.

In the method of completely removing second dam 17 with dicing blade 80 having a larger width during singulation, the cut surface of light-emitting device 1 has reduced mechanical strength because second dam 17 is completely removed. In the case where the distance is small from the end surface of light-emitting element 13 to the cut surface of light-emitting device 1, the durability of mechanical strength of light-emitting device 1 is reduced. In this method, although the size of the light-emitting device is reduced, the amount of the cut portion is increased and the area of mount substrate 10 needed for one light-emitting device remains the same before and after the cutting, not resulting in any advantage in cost reduction. In contrast, in the present embodiment, second dam 17 has higher mechanical strength than that of reflective member 18. Accordingly, by removing second dam 17 while part of second dam 17 is left, cost reduction can be compatible with the durability of mechanical strength of light-emitting device 1.

[4. Effects]

As described above, the light-emitting device according to the present embodiment includes a light-emitting element disposed on a mount substrate, a reflective resin disposed around the light-emitting element to cover the light-emitting element, and a dam disposed on opposite sides of the reflective member. The dam includes a resin dam and a surface layer covering at least part of the surface of the resin dam. The inner lateral surface of the resin dam facing the light-emitting element is covered with the surface layer, and at least part of the outer lateral surface of the resin dam not facing the light-emitting element is an exposed surface.

Such a configuration prevents exudation of a resin dam forming material to the upper portion of the extraction electrode adjacent to the resin dam disposed on the mount substrate, reducing failure of contacts in the extraction electrode. In the case where a plurality of light-emitting devices is formed on one mount substrate and is then singulated, the dam is cut off. Thus, the amount of the mount substrate to be used in production of the light-emitting device can be reduced while the number of light-emitting devices produced per unit area of the mount substrate is increased. Accordingly, a compact light-emitting device having excellent properties is achieved.

The exposed surface may be flush with the lateral surface of the mount substrate.

Such a configuration can enhance the strength of the light-emitting device after singulation.

The resin dam may include a first resin dam that does not have the exposed surface, and a second resin dam having the exposed surface. The surface layer may include a first surface layer covering the surface of the first resin dam, and a second surface layer covering the surface of the second resin dam other than the exposed surface of the second resin dam. The dam may include a first dam including the first resin dam and the first surface layer, and a second dam including the second resin dam and the second surface layer.

In such a configuration, the exposed surface is formed only in the second dam as part of the dam. In other words, by removing only part of the second dam, the plurality of light-emitting devices can be singulated while the strength thereof is kept.

A dam disposed near the light-emitting element results in a near-field pattern of light emission having a sharp light emission edge, achieving sharp light emission properties of the light-emitting device integrated into a system using an optical system. Such a device is useful in low beam lamps for head lamps.

The relation represented by ¼ of Wc1<Wc2<½ of Wc1 may be satisfied where the maximum width of the first dam is defined as Wc1 and the maximum width of the second dam is defined as Wc2.

Such a relation between Wc1 and Wc2 can decrease the size of the light-emitting device because part of the second dam is removed while the second dam is left in such an extent that the strength of the light-emitting device is kept.

The relation represented by Wb/Wc>0.94 may be satisfied where the maximum width of the first dam is defined as We and the width of the lower end of the first resin dam is defined as Wb.

In such a configuration, the ratio of the bottom width of the resin dam to the maximum width of the dam can exceed 0.94, enhancing the bonding strength of the dam to the mount substrate. This is because the dam of the present embodiment is higher than the resin dam and the surface layer formed of the same amount of dam forming material by the conventional method; as a result, the dam of the present embodiment has an increased cross-sectional area, dispersing the force vertically applied in the lateral surface direction of the dam. The resin dam has an increased bottom width, and thus an increased bottom area. As a result, the dam itself has a stable structure, increasing the bonding strength to the mount substrate.

The surface layer of the dam can have a reduced width, reducing the width of the dam and thus the area of the dam on the mount substrate.

The relation represented by H/Wc>0.80 may be satisfied where the maximum width of the first dam is defined as We and the height of the first dam is defined as H.

In such a configuration, the ratio of the height to the maximum width of the resin dam including the surface layer (dam is defined by the surface layer and the resin dam) exceeds 0.80. As a result, the area of the dam on the mount substrate is decreased. The amount of the mount substrate, which contains an expensive material of AlN, to be used in production of the light-emitting device can be reduced while the number of light-emitting elements per unit area of the mount substrate can be increased. The amount of the resin to be used can also be reduced, reducing cost.

The lower end of the first surface layer on the outer lateral surface of the first dam may have a width of less than 40 nm.

In such a configuration, the lower end breadth of the surface layer formed on the surface of the resin dam is less than 40 nm, and the resin dam forming material does not exude to the upper portion of the extraction electrode adjacent to the resin dam disposed on the mount substrate. Accordingly, failure of contacts in the extraction electrode can be reduced.

The dam may be disposed so as to continuously surround the light-emitting element.

In such a configuration, the light-emitting element is continuously surrounded with the dam, further preventing exudation of the resin dam forming material to the upper portion of the extraction electrode adjacent to the resin dam disposed on the mount substrate. Accordingly, failure of contacts in the extraction electrode can further be reduced.

The light-emitting element may include a plate-shaped wavelength converting member disposed on the light-emitting surface of the light-emitting element.

In such a configuration, a plate-shaped wavelength converting member is disposed on the light-emitting surface of the light-emitting element, sealing the light-emitting element with the reflective resin and the wavelength converting member. The wavelength converting member can also achieve desired light emission properties.

The height from the mount substrate to the vertex portion of the dam may be less than the height from the mount substrate to the top surface of the wavelength converting member.

In such a configuration, the height from the mount substrate to the vertex portion of the resin dam is less than the height from the mount substrate to the top surface of the wavelength converting member, reducing the amount of the reflective resin to be used. Accordingly, cost can be reduced.

The light-emitting device may include a protective element electrically connected to the light-emitting element, and the dam may have curved portions curved so as to approach its adjacent light-emitting element or protective element in a position adjacent to at least one of corners of the light-emitting element or the protective element.

In such a configuration, the dam forming material is approached to the semiconductor element by an electrostatic force during application of the dam forming material to the portions near the semiconductor element such as the light-emitting element or the protective element. Accordingly, even in the case where the dam forming material is ejected from a nozzle located away from the semiconductor element, the resin dam can be formed near the semiconductor element. As a result, the distance between the dam portions disposed on the opposite sides of a region including the light-emitting element can be shorter than the distance between the dam portions disposed on the opposite sides of a region not including the light-emitting element.

(Modification)

A modification of the present embodiment will now be described.

In the present modification, in the case where the light-emitting device has a structure in which a narrow line of the dam forming material is disposed close to the semiconductor element, the distance between the dam and the lateral surface of light-emitting element 13 is varied. For this reason, in some cases, the dam is not left on the inner side seen from light-emitting element 13 after the cutting because the dam is close to the setting position of light-emitting element 13 near the end of the lateral surface of light-emitting element 13 parallel to the dam. In this case, the dam in a region away from the lateral surface of light-emitting element 13 may be completely removed in the application direction of the dam forming material after the singulation step, as in second dam 17 illustrated in (a) of FIG. 1. In other words, reflective member 18 may be exposed from the end surface of light-emitting device 1 at the end thereof in some cases.

Actually, the dam shifted about 50 µm at an application distance of 100 µm. In this state, in the case where the difference between the dam width and the width of the dicing blade is 50 µm or less, no dam is present on the cut surface of light-emitting element 13 in a region away from the lateral surface of light-emitting element 13 in the application direction of the dam forming material. Accordingly, the distance between the light-emitting element and the dam is at least 0.05 mm or more and 0.10 mm or less.

Seen from the separated lateral surface of light-emitting device 1 as described above, the dam is within a region approximately identical to the region near the central region of light-emitting device 1 including light-emitting element 13, and reflective member 18 is present on the outer side of light-emitting element 13 (side remote from the light-emitting element). However, such a region without the dam is located away from light-emitting element 13. Because the proportion of exposed reflective member 18 is low, the properties of light-emitting device 1 are not significantly affected, resulting in compatibility between the maintenance of the intensity of light emission and a reduction in cost.

The light-emitting device according to the present embodiment has been described above, but the embodiment will not be limitative to the present disclosure.

For example, the dam can have any shape other than the shapes described above. For example, the dam may be formed on two opposite sides of a region including the light-emitting element and the reflective member, or may be continuously formed so as to surround the light-emitting element and the reflective member. A semiconductor element such as the protective element other than the light-emitting element may be included, or an element other than the semiconductor element may be further included.

The width and height of the dam and the thickness of the surface layer can be any numeric value other than those described above, and may be appropriately varied.

The material described above may be used for the mount substrate, the dam forming material, and the reflective member forming material. Another material may also be used.

Moreover, embodiments obtained by making a variety of modifications to the embodiment, or embodiments implemented by arbitrarily combining the constitutional components and functions of the embodiment and the modification without departing from the gist of the present disclosure are also included in the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be used as light-emitting devices, such as light emitting diodes and laser diodes, which are used as light sources for head lamps of vehicles, and those for outdoor and indoor lightings.

What is claimed is:

1. A light-emitting device, comprising:
a light-emitting element disposed on a mount substrate;
a reflective resin disposed around the light-emitting element to cover the light-emitting element; and
a first dam and a second dam disposed on opposite sides of the reflective resin,
wherein the first dam includes a first resin dam, and a first surface layer covering a surface of the first resin dam,
the second dam includes a second resin dam, and a second surface layer covering a surface of the second resin dam, and
when viewed in a cross-section taken in a direction vertical to the mount substrate:
an inner lateral surface of the second resin dam facing the light-emitting element is covered with the second surface layer and a lower end of the second surface layer is in contact with the mount substrate,
at least part of an outer lateral surface of the second resin dam not facing the light-emitting element is an exposed surface of the second resin dam; and
an inner lateral surface of the first resin dam facing the light-emitting element and an outer lateral surface of the first resin dam not facing the light-emitting element are completely covered with the first surface layer, and a lower end of the first surface layer is in contact with the mount substrate.

2. The light-emitting device according to claim 1, wherein the exposed surface of the second resin dam is flush with a lateral surface of the mount substrate.

3. The light-emitting device according to claim 1, wherein a relation represented by ¼ of Wc1<Wc2<½ of Wc1 is satisfied where a maximum width of the first dam is defined as Wc1 and a maximum width of the second dam is defined as Wc2.

4. The light-emitting device according to claim 1, wherein a relation represented by Wb/Wc>0.94 is satisfied where a maximum width of the first dam is defined as Wc and a width of a lower end of the first resin dam is defined as Wb.

5. The light-emitting device according to claim 1, wherein a relation represented by H/Wc>0.80 is satisfied where a maximum width of the first dam is defined as Wc and a height of the first dam is defined as H.

6. The light-emitting device according to claim 1, wherein a lower end of the first surface layer on an outer lateral surface of the first dam has a width of less than 40 nm.

7. The light-emitting device according to claim 1, wherein a distance between the light-emitting element and the second dam is 0.05 mm or more and 0.10 mm or less.

8. The light-emitting device according to claim 1, wherein the first dam and the second dam are connected so as to continuously surround the light-emitting element in a plan view.

9. The light-emitting device according to claim 1, wherein a plate-shaped wavelength converting member is disposed on a light-emitting surface of the light-emitting element.

10. The light-emitting device according to claim 9, wherein a height from the mount substrate to a vertex portion of the first dam is less than a height from the mount substrate to a top surface of the wavelength converting member.

11. The light-emitting device according to claim 1, further comprising:
a protective element electrically connected to the light-emitting element,
wherein in a plan view, at least one of the first dam and the second dam includes curved portions curved so as to approach the light-emitting element or protective element adjacent to the at least one of the first dam and the second dam in a position adjacent to at least one of corners of the light-emitting element or the protective element.

* * * * *